(12) United States Patent
Park et al.

(10) Patent No.: US 12,211,806 B2
(45) Date of Patent: Jan. 28, 2025

(54) SEMICONDUCTOR PACKAGE WITH DUMMY PATTERN NOT ELECTRICALLY CONNECTED TO CIRCUIT PATTERN

(71) Applicant: Samsung Electronics Co., Ltd., Suwon-si (KR)

(72) Inventors: Jin-Woo Park, Seoul (KR); Un-Byoung Kang, Hwaseong-si (KR); Jong Ho Lee, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 18/301,606

(22) Filed: Apr. 17, 2023

(65) Prior Publication Data
US 2023/0253343 A1 Aug. 10, 2023

Related U.S. Application Data

(63) Continuation of application No. 17/168,337, filed on Feb. 5, 2021, now Pat. No. 11,658,131.

(30) Foreign Application Priority Data

Jun. 8, 2020 (KR) .................. 10-2020-0069123

(51) Int. Cl.
*H01L 23/498* (2006.01)
*H01L 21/56* (2006.01)
(Continued)

(52) U.S. Cl.
CPC ............ *H01L 23/562* (2013.01); *H01L 23/14* (2013.01); *H01L 23/485* (2013.01);
(Continued)

(58) Field of Classification Search
CPC ............ H01L 23/544; H01L 2223/544; H01L 2224/03011; H01L 2224/03019;
(Continued)

(56) References Cited

U.S. PATENT DOCUMENTS 6,087,596 A 7/2000 Liu
6,413,620 B1 7/2002 Kimura et al.
(Continued)

FOREIGN PATENT DOCUMENTS

JP H09260434 A 10/1997
JP 2005039239 A 2/2005
(Continued)

OTHER PUBLICATIONS

Office Action for corresponding Taiwanese Patent Application No. 110118514 issued on Sep. 6, 2024.

*Primary Examiner* — Kretelia Graham
*Assistant Examiner* — William Henry Anderson
(74) *Attorney, Agent, or Firm* — Harness, Dickey & Pierce, P.L.C.

(57) ABSTRACT

A semiconductor package includes a first substrate including a circuit pattern and a dummy pattern on an upper face of the first substrate, a solder ball, a second substrate on the first substrate, and an underfill material layer between the first and second substrates. The underfill material layer wraps around the solder ball. The dummy pattern is not electrically connected to the circuit pattern. The first substrate includes a solder resist layer on the circuit pattern and the dummy pattern. The solder resist layer includes a first opening for exposing at least a part of the circuit pattern. The solder ball is in the first opening and electrically insulated from the dummy pattern by the solder resist layer. The second substrate is electrically connected to the first substrate by the solder ball. The second substrate is electrically insulated from the dummy pattern by the solder resist layer.

19 Claims, 18 Drawing Sheets

(51) Int. Cl.
  *H01L 23/00*    (2006.01)
  *H01L 23/14*    (2006.01)
  *H01L 23/485*   (2006.01)
  *H01L 23/538*   (2006.01)

(52) U.S. Cl.
  CPC .... *H01L 23/49816* (2013.01); *H01L 23/5385* (2013.01); *H01L 24/14* (2013.01); *H01L 21/563* (2013.01); *H01L 23/49838* (2013.01)

(58) Field of Classification Search
  CPC . H01L 2224/11011; H01L 2224/11019; H01L 2224/27011; H01L 2224/27019; H01L 2224/06179; H01L 2224/09179; H01L 2224/14179; H01L 2224/17179; H01L 2224/30179; H01L 25/0652; H01L 25/0655; H01L 25/0657; H05K 2201/09409; H05K 2201/09781; H05K 2201/0989; H05K 2201/099; H05K 2201/10204
  See application file for complete search history.

(56) References Cited

U.S. PATENT DOCUMENTS

| | | |
|---|---|---|
| 6,818,972 B2 | 11/2004 | Jimarez et al. |
| 8,536,718 B2 | 9/2013 | Ko et al. |
| 8,633,586 B2 | 1/2014 | Kim et al. |
| 2008/0006918 A1 | 1/2008 | Nagatanini |
| 2008/0107863 A1 | 5/2008 | Ikeda et al. |
| 2012/0100671 A1* | 4/2012 | Kim ........ H01L 24/83 438/118 |
| 2014/0083747 A1 | 3/2014 | Matsuno et al. |
| 2017/0194221 A1* | 7/2017 | Davis ........ H01L 22/34 |
| 2018/0040549 A1 | 2/2018 | Shim et al. |
| 2019/0214359 A1* | 7/2019 | Yeon ...... H01L 21/565 |
| 2020/0126899 A1 | 4/2020 | Lee et al. |
| 2020/0185367 A1* | 6/2020 | Bhagavat ........ H01L 25/16 |
| 2020/0203300 A1* | 6/2020 | Huang ........ H01L 24/14 |
| 2020/0312770 A1* | 10/2020 | Lu ........ H01L 21/486 |
| 2020/0312789 A1 | 10/2020 | Kim et al. |
| 2022/0068756 A1* | 3/2022 | Jang ........ H01L 23/562 |
| 2022/0077039 A1* | 3/2022 | Jang ........ H01L 21/486 |

FOREIGN PATENT DOCUMENTS

| | | |
|---|---|---|
| KR | 100400032 B1 | 9/2003 |
| KR | 20100088336 A | 8/2010 |
| KR | 101542887 B1 | 8/2015 |
| KR | 20150089618 A | 8/2015 |
| TW | 201712812 A | 4/2017 |

\* cited by examiner

SEMICONDUCTOR PACKAGE WITH DUMMY PATTERN NOT ELECTRICALLY CONNECTED TO CIRCUIT PATTERN

CROSS-REFERENCE TO RELATED APPLICATIONS

This application is a continuation of U.S. patent application Ser. No. 17/168,337, filed on Feb. 5, 2021, which claims priority under 35 U.S.C. § 119 to Korean Patent Application No. 10-2020-0069123, filed on Jun. 8, 2020 in the Korean Intellectual Property Office, the disclosures of each of which are incorporated by reference herein in their entirety.

TECHNICAL FIELD

Example embodiments of the present disclosure relate to a semiconductor package.

DISCUSSION OF RELATED ART

With trends of miniaturization, slimness, and densification of electronic products, miniaturization of and slimness of printed circuit boards also progress at the same time. Also, the design of the printed circuit board becomes complicated due to multi-function, large-capacity data transmission and reception in addition to portability of the electronic devices, and the like, and a high-level technology is required. Therefore, the demand for a multilayer printed circuit board on which a power supply circuit, a ground circuit, a signal circuit, and the like are formed increases.

Various semiconductor chips such as a central processing unit and a power integrated circuit are mounted on the multilayer printed circuit board. High-temperature heat may generate in the semiconductor chips during operation. When the high-temperature heat is transferred to the semiconductor chip that performs the memory function, malfunction such as destruction of the memory cell may be induced.

Meanwhile, as the multilayer printed circuit boards become more and more slim, a warpage may increase on the multilayer printed circuit boards. When warpage of the multilayer printed circuit boards increases, ball (e.g., solder ball) contacts may open to cause of malfunction of the semiconductor chip.

SUMMARY

Aspects of the present disclosure provide a semiconductor package capable of limiting and/or preventing spread of cracks which occur in an underfill material layer between a PCB substrate and an interposer substrate.

According to an example embodiment, a semiconductor package includes a first substrate including a circuit pattern and a dummy pattern on an upper face of the first substrate, a solder ball, a second substrate on the first substrate, and an underfill material layer between the first substrate and the second substrate. The underfill material layer wraps around the solder ball. The dummy pattern is not electrically connected to the circuit pattern. The first substrate includes a solder resist layer on the circuit pattern and the dummy pattern. The solder resist layer includes a first opening for exposing at least a part of the circuit pattern. The solder ball is in the first opening. The solder ball is electrically insulated from the dummy pattern by the solder resist layer. The second substrate is electrically connected to the first substrate by the solder ball. The second substrate is electrically insulated from the dummy pattern by the solder resist layer.

According to an example embodiment, a semiconductor package includes a first substrate, a second substrate, a stiffener, a first semiconductor chip on the second substrate, a second semiconductor chip on the second substrate, and a third semiconductor chip on the second substrate. The first substrate includes a solder resist layer, a circuit pattern at least partially exposed by the solder resist layer, and a plurality of dummy patterns buried by the solder resist layer and not electrically connected to the circuit pattern. The plurality of dummy patterns include a first dummy pattern, a second dummy pattern, a third dummy pattern, and a fourth dummy pattern. The second substrate is on the first substrate. The second substrate includes a first side wall and a third side wall extending in a first direction and spaced apart from each other in a second direction different from the first direction. The second substrate includes a second side wall and a fourth side wall extending in the second direction and spaced apart from each other in the first direction. The first side wall and the second side wall join at a first corner. The fourth side wall and the first side wall join at a second corner. The second side wall and the third side wall join at a third corner. The third side wall and the fourth side wall join at a fourth corner. The stiffener is on the first substrate and surrounds a periphery of the second substrate. The second semiconductor chip and the third semiconductor chip on the second substrate are arranged respectively at both sides of the first semiconductor chip in the first direction such that the first semiconductor chip is between the second semiconductor chip and the third semiconductor chip. The first semiconductor chip, the second semiconductor chip, and the third semiconductor chip are electrically connected to each other through the second substrate. The first dummy pattern, the second dummy pattern, the third dummy pattern, and the fourth dummy pattern overlap the first corner, the second corner, the third corner, and the fourth corner, respectively.

According to an example embodiment, a semiconductor package includes a first substrate, a first solder ball, a second solder ball, a second substrate, an underfill material layer, a first semiconductor chip, a second semiconductor chip, and a stiffener. The first substrate includes a base substrate, a circuit pattern on the base substrate, a dummy pattern on the base substrate and not being electrically connected to the circuit pattern, and a solder resist layer on the circuit pattern and the dummy pattern, the solder resist layer including a first opening that exposes at least a part of the circuit pattern. The first solder ball is in the first opening. The first solder ball is not electrically connected to the dummy pattern. The second substrate is electrically connected to the first substrate through the first solder ball. The second substrate is not electrically connected to the dummy pattern. The second substrate includes a substrate layer including a penetration electrode connected to the first solder ball, and a wiring layer on the substrate layer and connected to the penetration electrode. The second substrate includes a first side wall and a third side wall extending in a first direction and spaced apart from each other in a second direction different from the first direction. The second substrate includes a second side wall and a fourth side wall extending in the second direction and spaced apart from each other in the first direction. The first side wall and the second side wall join at a first corner. The fourth side wall and the first side wall join at a second corner. The second side wall and the third side wall join at a third corner. The third side wall and the fourth side wall join at a fourth corner. The first corner, the second corner, the third corner, and the fourth corner are overlapped by the dummy pattern. The underfill material layer wraps around the first solder ball between the first substrate and the second substrate. The first semiconductor chip and the second semiconductor chip are on the second substrate. The first semiconductor chip and the second semiconductor chip are electrically connected to the second substrate through the second solder ball and electrically connected to each other through the wiring layer. The stiffener is on the first substrate. The stiffener is spaced apart from the second substrate.

However, aspects of the present disclosure are not restricted to those discussed above. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
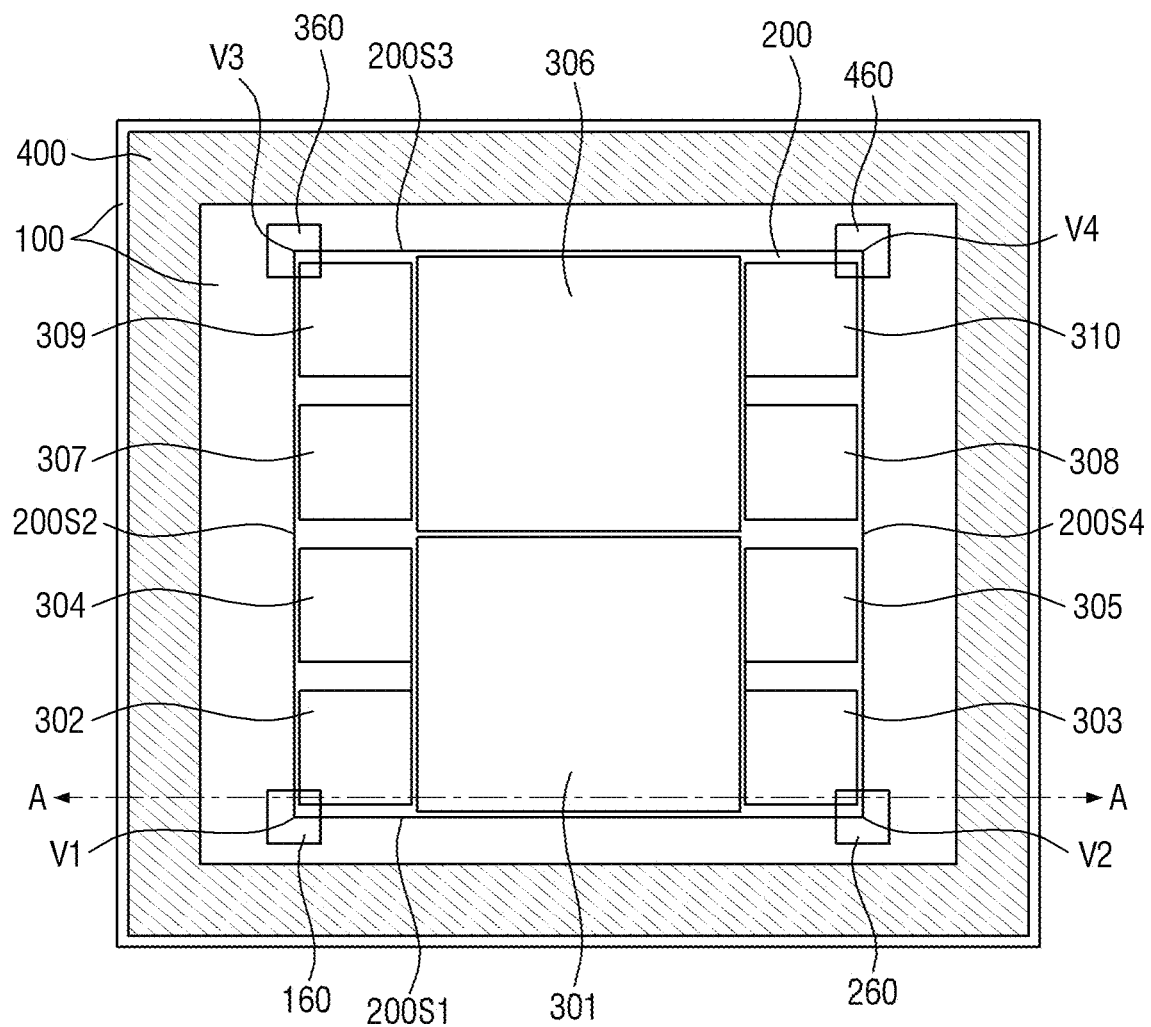
FIG. 1 is an example layout diagram for explaining a semiconductor package according to example embodiments.
Figure 1:
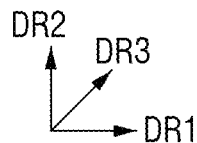

FIG. 1 is an example layout diagram for explaining a semiconductor package according to example embodiments.

Referring to FIG. 1, the semiconductor package according to some embodiments of the present disclosure may include a first substrate 100, a second substrate 200, a first semiconductor chip 301, a second semiconductor chip 302, a third semiconductor chip 303, a fourth semiconductor chip 304, a fifth semiconductor chip 305, a sixth semiconductor chip 306, a seventh semiconductor chip 307, an eighth semiconductor chip 308, a ninth semiconductor chip 309, a tenth semiconductor chip 310 and a stiffener 400. Although the drawings show that the first to tenth semiconductor chips 301, 302, 303, 304, 305, 306, 307, 308, 309 and 310 are disposed on the second substrate 200, the scope of the present disclosure is not limited to the number of semiconductor chips. That is, two or more semiconductor chips may be disposed on the second substrate 200.

The second substrate 200 may be disposed on the first substrate 100. The second substrate 200 may include first to fourth side walls 200S1, 200S2, 200S3 and 200S4, and first to fourth corners V1, V2, V3 and V4. The first and third side walls 200S1 and 200S3 may be spaced apart from each other in a second direction DR2, and may extend in a first direction DR1. The second and fourth side walls 200S2 and 200S4 may be spaced part from each other in the first direction DR1, and may extend in the second direction DR2. Here, the second direction DR2 may be a direction different from the first direction DR1, and may intersect the first direction DR1.

The first side wall 200S1 and the second side wall 200S2 may join at a first corner V1. The second side wall 200S2 and the third side wall 200S3 may join at a third corner V3. The third side wall 200S3 and the fourth side wall 200S4 may join at a fourth corner V1. The fourth side wall 200S4 and the first side wall 200S1 may join at a second corner V2.

Meanwhile, the first substrate 100 may include first to fourth dummy patterns 160, 260, 360 and 460. The first to fourth dummy patterns 160, 260, 360 and 460 may be disposed on an upper face of the first substrate 100. The first to fourth dummy patterns 160, 260, 360 and 460 may be disposed on the first to fourth corners V1, V2, V3 and V4 of the second substrate 200, respectively. The first to fourth dummy patterns 160, 260, 360 and 460 may overlap the first to fourth corners V1, V2, V3 and V4 of the second substrate 200, respectively. The first to fourth dummy patterns 160, 260, 360 and 460 may overlap, for example, the first to fourth corners V1, V2, V3 and V4 of the second substrate 200 in a third direction DR3, respectively. Here, the third direction DR3 may be a direction different from each of the first and second directions DR1 and DR2, and may intersect the first and second directions DR1 and DR2. The third direction DR3 may be a thickness direction of the first substrate 100 and/or the second substrate 200.

For example, the first dummy pattern 160 of the first substrate 100 may overlap the first corner V1 of the second substrate 200. The second dummy pattern 260 of the first substrate 100 may overlap the second corner V2 of the second substrate 200. The third dummy pattern 360 of the first substrate 100 may overlap the third corner V3 of the second substrate 200. The fourth dummy pattern 460 of the first substrate 100 may overlap the fourth corner V4 of the second substrate 200.

The first to fourth dummy patterns 160, 260, 360 and 460 may have, for example, a rectangular shape. The first to fourth corners V1, V2, V3 and V4 may be disposed within the rectangular shape of the first to fourth dummy patterns 160, 260, 360 and 460. For example, the first to fourth corners V1, V2, V3 and V4 may be disposed at the centers of the first to fourth dummy patterns 160, 260, 360 and 460. However, the present disclosure is not limited thereto, and the first to fourth corners V1, V2, V3 and V4 are not disposed at the centers of the first to fourth dummy patterns 160, 260, 360 and 460, but may be disposed to overlap the first to fourth dummy patterns 160, 260, 360 and 460.

The first to fourth dummy patterns 160, 260, 360 and 460 may have, for example, rectangular shapes of substantially the same size. However, the scope of the present disclosure is not limited thereto, and the sizes of the first to fourth dummy patterns 160, 260, 360 and 460 may be different from each other.

The first to tenth semiconductor chips 301, 302, 303, 304, 305, 306, 307, 308, 309 and 310 may be disposed on the second substrate 200. The first to tenth semiconductor chips 301, 302, 303, 304, 305, 306, 307, 308, 309 and 310 may be spaced apart from each other.

For example, the second and third semiconductor chips 302 and 303 may be spaced apart from each other in the first direction DR1, and may be disposed on both sides of the first semiconductor chip 301 in the first direction DR1. The fourth and fifth semiconductor chips 304 and 305 may be spaced apart from each other in the first direction DR1, and may be disposed on both sides of the first semiconductor chip 301 in the first direction DR1. The second and fourth semiconductor chips 302 and 304 may be spaced apart from each other in the second direction DR2, and may be disposed on one side of the first semiconductor chip 301 in the first direction DR1. The third and fifth semiconductor chips 303 and 305 may be spaced apart from each other in the second direction DR2, and may be disposed on the other side of the first semiconductor chip 301 in the first direction DR1.

The seventh and eighth semiconductor chips 307 and 308 may be spaced apart from each other in the first direction DR1, and may be disposed on both sides of the sixth semiconductor chip 306 in the first direction DR1. The ninth and tenth semiconductor chips 309 and 310 may be spaced apart from each other in the first direction DR1, and may be disposed on both sides of the sixth semiconductor chip 306 in the first direction DR1. The seventh and ninth semiconductor chips 307 and 309 may be spaced apart from each other in the second direction DR2, and may be disposed on one side of the sixth semiconductor chip 306 in the first direction DR1. The eighth and tenth semiconductor chips 308 and 310 may be spaced apart from each other in the second direction DR2, and may be disposed on the other side of the sixth semiconductor chip 306 in the first direction DR1.

The first and fifth semiconductor chips 301 and 305 may be spaced apart from each other in the first direction DR1. The fourth and seventh semiconductor chips 304 and 307 may be spaced apart from each other in the second direction DR2. The fifth and eighth semiconductor chips 305 and 308 may be spaced apart from each other in the second direction DR2.

Each of the first to tenth semiconductor chips 301, 302, 303, 304, 305, 306, 307, 308, 309 and 310 may be semiconductor chips that perform a specific function. Each of the first to tenth semiconductor chips 301, 302, 303, 304, 305, 306, 307, 308, 309 and 310 may include processing circuitry such as hardware including logic and/or memory circuits; a hardware/software combination such as a processor executing software; or a combination thereof. For example, the first and sixth semiconductor chips 301 and 306 may be semiconductor chips that perform logic functions. The second to fifth semiconductor chips 302, 303, 304 and 305 and the seventh to tenth semiconductor chips 307, 308, 309 and 310 may be memory chips that perform the storage function of the memory device.

Each of the first and sixth semiconductor chips 301 and 306 may be, for example, a central processing unit (CPU), a controller, an on-demand semiconductor (application specific integrated circuit, ASIC), and the like. Each of the second to fifth semiconductor chips 302, 303, 304 and 305 and the seventh to tenth semiconductor chips 307, 308, 309 and 310 may be, for example, a volatile memory chip such as a DRAM (Dynamic Random Access Memory) or an SRAM (Static RAM), or a non-volatile memory chip such as a PRAM (Phase-change RAM), a MRAM (Magneto resistive RAM), a FeRAM (Ferroelectric RAM) or a RRAM (Resistive RAM), or an HBM (High Bandwidth Memory) memory chip in which a plurality of DRAM memory chips is stacked. However, the scope of the present disclosure is not limited thereto.

The stiffener 400 may be disposed on the first substrate 100. The stiffener 400 may be disposed on the first substrate 100 to be spaced apart from the first to fourth dummy patterns 160, 260, 360 and 460. The stiffener 400 may extend on the first substrate 100 along the periphery of the second substrate 200. The stiffener 400 may include portions facing each of the first to fourth side walls 200S1, 200S2, 200S3 and 200S4 of the second substrate 200.

The stiffener 400 may be a boundary structure (e.g., perimeter wall) and may include, for example, metallic materials such copper (Cu), aluminum (Al), silver (Ag), tin (Sn), gold (Au), nickel (Ni), lead (Pb), titanium (Ti), iron (Fe) or alloys thereof. However, the scope of the present disclosure is not limited thereto.

Figure 2:
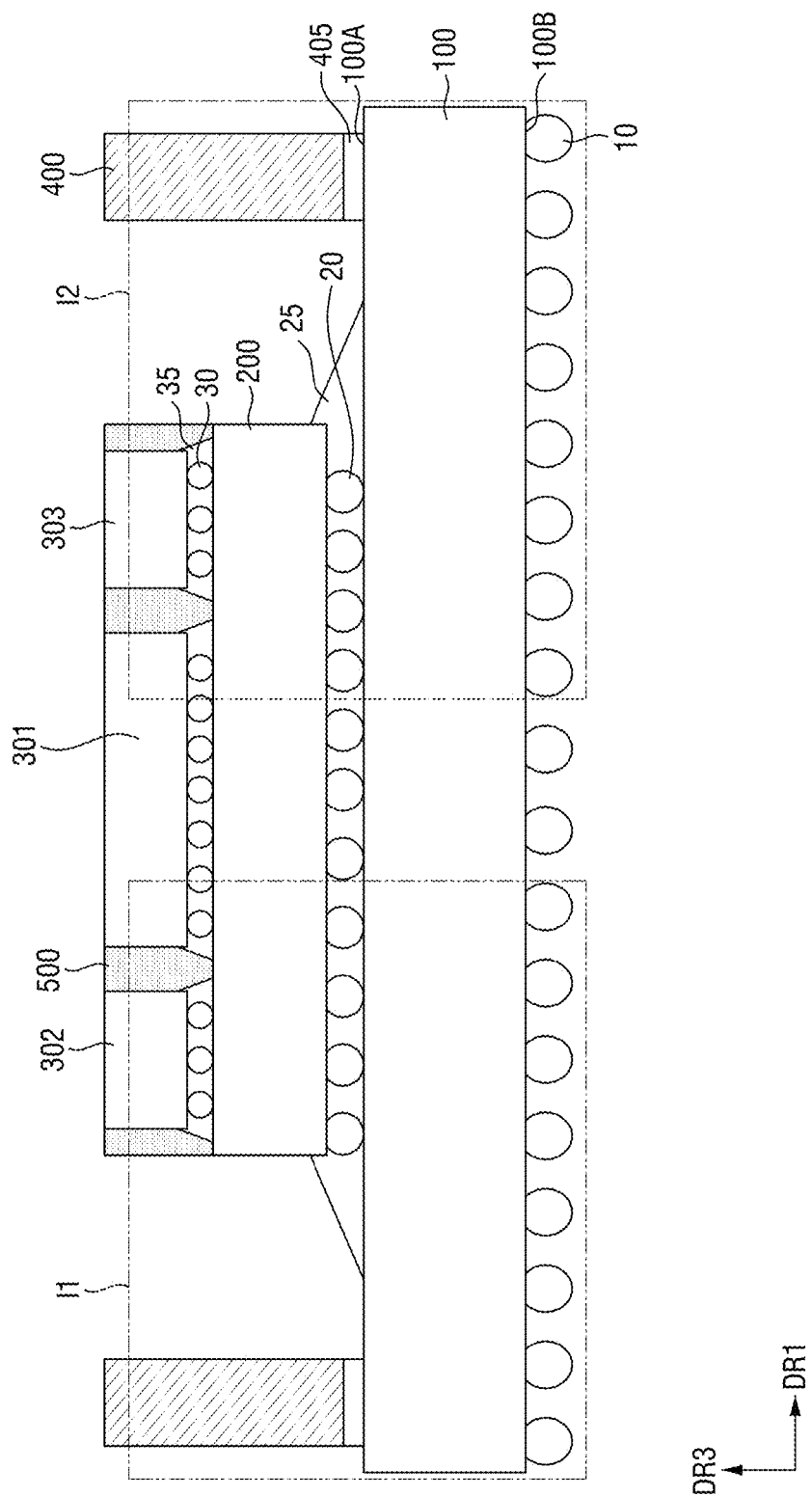
FIG. 2 is a cross-sectional view taken along a line A-A of FIG. 1.

FIG. 2 is a cross-sectional view taken along a line A-A of FIG. 1.

Referring to FIGS. 1 and 2, the first substrate 100 may include a first face 100A and a second face 100B opposite to each other. The first face 100A and the second face 100B may be, for example, opposite to each other in the third direction DR3. The first face 100A may be an upper face of the first substrate 100, and the second face 100B may be a lower face. The first substrate 100 may be, for example, a printed circuit board (PCB). However, the scope of the present disclosure is not limited thereto.

The first solder balls 10 may be disposed on the second face 100B of the first substrate 100. The first solder ball 10 may transfer a signal, which is transmitted from the outside, to the first to tenth semiconductor chips 301, 302, 303, 304, 305, 306, 307, 308, 309 and 310 through the second substrate 200, or may output signals, which are output from the first to tenth semiconductor chips 301, 302, 303, 304, 305, 306, 307, 308, 309 and 310, to the outside through the second substrate 200.

The second substrate 200 may be disposed on the first face 100A of the first substrate 100. The second substrate 200 may be, for example, an interposer. The second substrate 200 may include at least one of silicon, glass, ceramic or plastic. However, the technical idea of the present disclosure is not limited thereto.

The second substrate 200 may be electrically connected to the first substrate 100 through the second solder balls 20. The second solder ball 20 may be disposed between the second substrate 200 and the first face 100A of the first substrate 100.

A first underfill material layer 25 may be disposed between the second substrate 200 and the first face 100A of the first substrate 100. The first underfill material layer 25 may fill a space between the second solder balls 20, and may wrap the second solder balls 20. The first underfill material layer 25 may protect the second solder balls 20.

The first to third semiconductor chips 301, 302 and 303 may be disposed on the second substrate 200. The first to third semiconductor chips 301, 302 and 303 may be electrically connected to the second substrate 200 through the third solder balls 30. Also, the first to third semiconductor chips 301, 302 and 303 may be electrically connected to each other through the third solder ball 30 and the second substrate 200.

A second underfill material layer 35 may be disposed between the second substrate 200 and the first to third semiconductor chips 301, 302 and 303. The second underfill material layer 35 may fill a space between the third solder balls 30, and may wrap the third solder balls 30. The second underfill material layer 35 may protect the third solder balls 30.

As shown in this drawings, the sizes of the first to third solder balls 10, 20 and 30 may be different from each other. For example, the size of the first solder ball 10 may be larger than that of the second solder ball 20, and the size of the second solder ball 20 may be larger than that of the third solder ball 30. However, the present disclosure is not limited thereto.

Although the first to third solder balls 10, 20 and 30 may include, for example, at least one of tin (Sn), indium (In), lead (Pb), zinc (Zn), nickel (Ni), gold (Au), silver (Ag), copper (Cu), antimony (Sb), bismuth (Bi), and a combination thereof, the technical idea of the present disclosure is not limited thereto.

The first and second underfill material layers 25 and 35 may include an epoxy-based resin, benzocyclobutyne or polyimide. However, the embodiments are not limited thereto. For example, the first and second underfill material layers 25 and 35 may further include a silica filler. In another example, the first and second underfill material layers 25 and 35 may include an adhesive and a flux. The flux may include an oxide film removing agent. In still another example, the first and second underfill material layers 25 and 35 may include a silica filler or flux. In still another example, the first and second underfill material layers 25 and 35 may include a non-conductive paste.

A molding layer 500 may be disposed on the second substrate 200. The molding layer 500 may be interposed between the first to third semiconductor chips 301, 302 and 303. The molding layer 500 may wrap the first to third semiconductor chips 301, 302 and 303 and the second underfill material layer 35. The molding layer 500 may protect the first to third semiconductor chips 301, 302 and 303 and the second underfill material layer 35.

The molding layer 500 may expose the upper faces of the first to third semiconductor chips 301, 302 and 303. For example, as shown in this drawing, the upper face of the molding layer 500 may be placed on the same plane as the upper faces of the first to third semiconductor chips 301, 302 and 303. However, the present disclosure is not limited thereto. For example, the molding layer 500 may cover the upper faces of the first to third semiconductor chips 301, 302 and 303.

The molding layer 500 may include, for example, an epoxy molding compound (EMC) or two or more kinds of silicon hybrid materials.

The stiffener 400 may be disposed on the first face 100A of the first substrate 100 by an adhesive layer 405. The stiffener 400 may be disposed on the first face 100A of the first substrate 100 to be spaced apart from the second substrate 200 in the first direction DR1. That is, the stiffener 400 may be disposed on both sides of the second substrate 200. The stiffener 400 may prevent an occurrence of warpage on the first substrate 100 and/or the second substrate 200.

Figure 3:
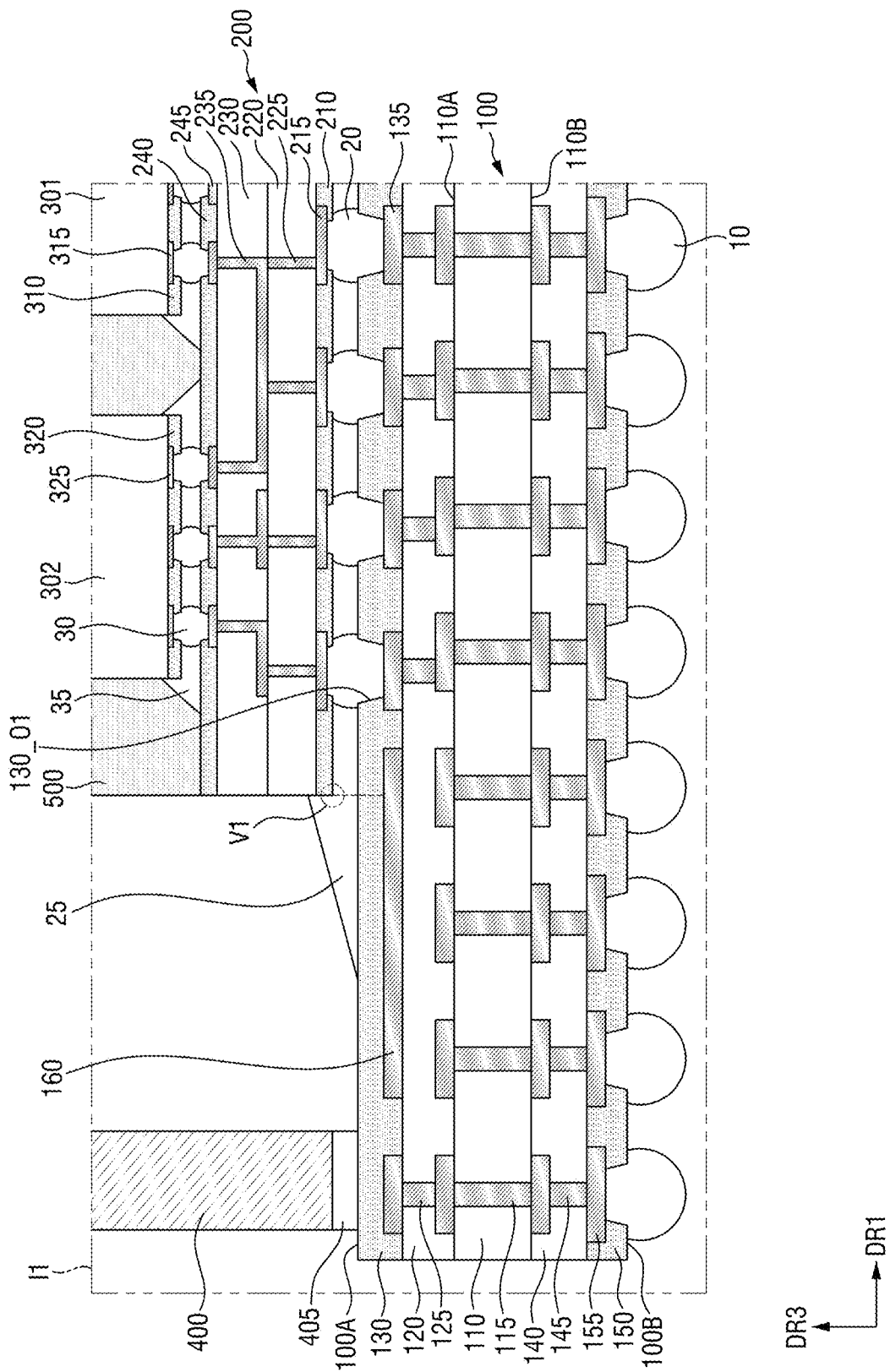
FIG. 3 is an enlarged view of a region I1 of FIG. 2.
Figure 4:
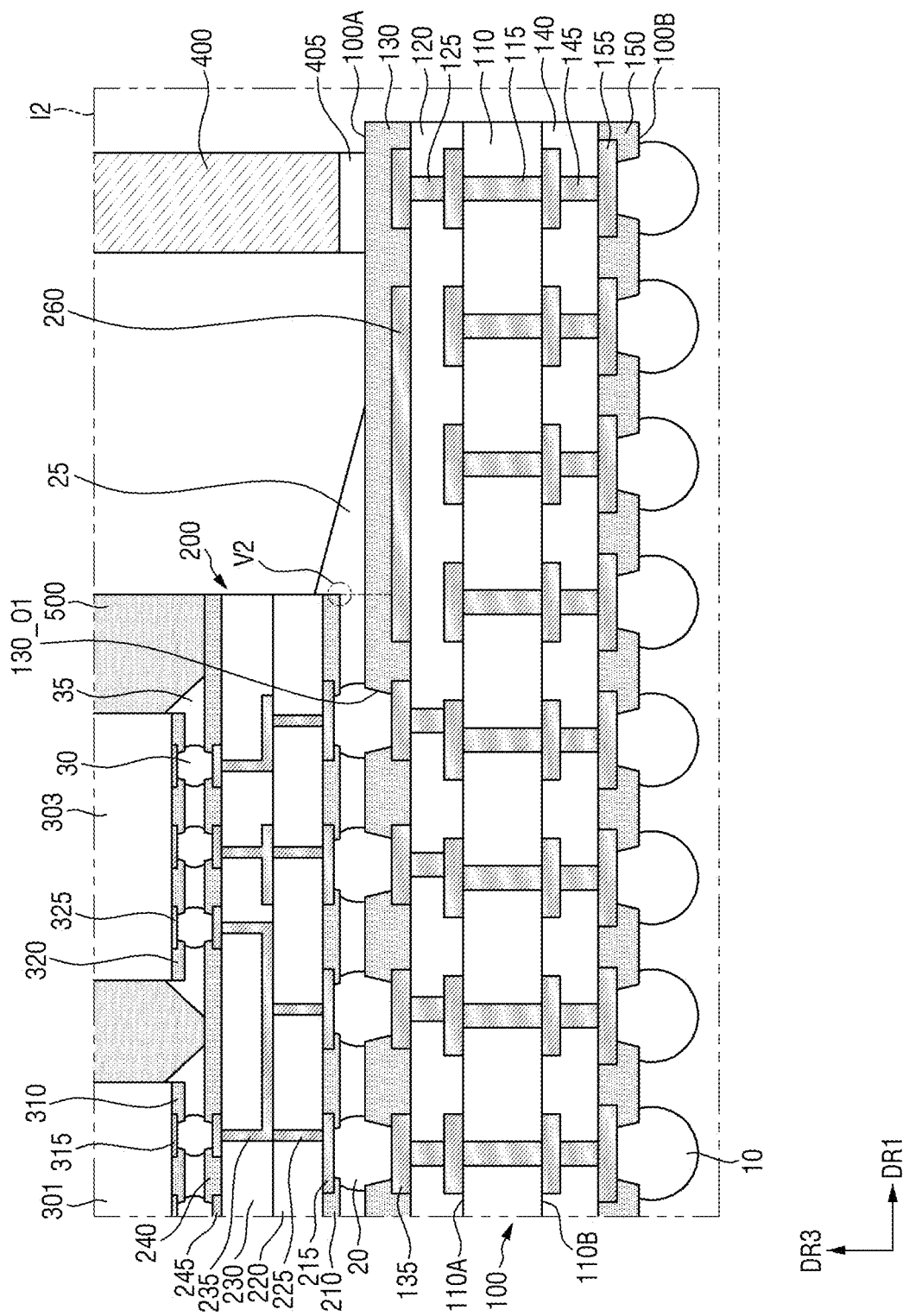
FIG. 4 is an enlarged view of a region I2 of FIG. 2.

FIG. 3 is an enlarged view of a region I1 of FIG. 2. FIG. 4 is an enlarged view of a region I2 of FIG. 2.

Referring to FIGS. 3 and 4, the first substrate 100 may include a base substrate 110, a first layer 120, a first solder resist layer 130, a second layer 140, and a second solder resist layer 150.

The base substrate 110 may include an upper face 110A and a lower face 100B opposite to each other. The upper face 110A and the lower surface 110B of the base substrate 110 may be opposite to each other in the third direction DR3. The base substrate 110 may include an internal pattern 115. The internal pattern 115 may penetrate the base substrate 110.

The base substrate 110 may be made of at least one material selected from phenol resin, epoxy resin, and polyimide. The base substrate 110 may include, for example, at least one material selected from FR4, tetrafunctional epoxy, polyphenylene ether, epoxy/polyphenylene oxide, BT (bis-maleimide triazine), thermount, cyanate ester, polyimide, and liquid crystal polymer.

The first layer 120 may be disposed on the upper face 110A of the base substrate 110. The first wiring pattern 125 may be disposed in the first layer 120. The first wiring pattern 125 may be disposed on the internal pattern 115 and may be electrically connected to the internal pattern 115.

A first solder resist layer 130 may be disposed on the first layer 120. A first circuit pattern 135, a first dummy pattern 160 and a second dummy pattern 260 may be disposed in the first solder resist layer 130.

The first solder resist layer 130 may include a first opening 130_O1 that exposes at least a part of the first circuit pattern 135. The first solder resist layer 130 may cover the first and second dummy patterns 160 and 260. The first solder resist layer 130 may surround the first and second dummy patterns 160 and 260.

The first circuit pattern 135 may be disposed on the first wiring pattern 125, and may be electrically connected to the first wiring pattern 125.

The first and second dummy patterns 160 and 260 may be electrically insulated from the first wiring pattern 125 and the first circuit pattern 135. That is, the first and second dummy patterns 160 and 260 may mean patterns that are electrically insulated from the conductive patterns in the first substrate 100. Further, the first and second dummy patterns 160 and 260 may be electrically insulated from the second substrate 200. The first and second dummy patterns 160 and 260 may be electrically insulated from the second substrate 200 by the first solder resist layer 130.

The thickness of the first and second dummy patterns 160 and 260 in the third direction DR3 may be, for example, about 10 μm or more and 20 μm or less. The thickness of the first solder resist layer 130 disposed on the upper faces of the first and second dummy patterns 160 and 260 in the third direction DR3 may be, for example, about 10 μm or more.

On the other hand, the second layer 140 may be disposed on the lower face 110B of the base substrate 110. The second wiring pattern 145 may be disposed in the second layer 140. The second wiring pattern 145 may be disposed on the internal pattern 115, and may be electrically connected to the internal pattern 115.

The second solder resist layer 150 may be disposed on the second layer 140. The second circuit pattern 155 may be disposed in the second solder resist layer 150. The second solder resist layer 150 may expose at least a part of the second circuit pattern 155.

The internal pattern 115, the first wiring pattern 125, the second wiring pattern 145, the first circuit pattern 135 and the second circuit pattern 155 may include, for example, a conductive material. For example, the internal pattern 115, the first wiring pattern 125, the second wiring pattern 145, the first circuit pattern 135 and the second circuit pattern 155 may include at least one metal or metal alloy selected from the group consisting of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn) and carbon (C).

The first solder ball 10 may be disposed on the second circuit pattern 155 exposed by the second solder resist layer 150. The first solder ball 10 may be in contact with the second circuit pattern 155. As a result, the first solder ball 10 may be electrically connected to the second circuit pattern 155, and may be electrically connected to the first substrate 100.

The second substrate 200 may include a first passivation layer 210, a substrate layer 220, a wiring layer 230 and a second passivation layer 240.

The first passivation layer 210 may be disposed on the lower face of the second substrate 200 in the third direction DR3. The first passivation layer 210 may expose at least a part of the first connection pad 215.

The second solder ball 20 may be disposed on the first connection pad 215 exposed by the first passivation layer 210 and the first opening 130_O1 included in the first solder resist layer 130. The second solder ball 20 may be electrically connected to the first connection pad 215 and the first circuit pattern 135.

The substrate layer 220 may be disposed on the first passivation layer 210. The substrate layer 220 may include, for example, silicon.

The substrate layer 220 may include penetration electrodes 225. The penetration electrodes 225 may penetrate the substrate layer 220 and be disposed on the first connection pad 215. The penetration electrodes 225 may be electrically connected to the first connection pad 215.

The wiring layer 230 may be disposed on the substrate layer 220. The wiring layer 230 may include a plurality of redistribution patterns 235. The redistribution patterns 235 may be disposed on the penetration electrode 225. The redistribution patterns 235 may be electrically connected to the penetration electrode 225. Further, the redistribution patterns 235 may electrically connect the first semiconductor chip 301 and the second semiconductor chip 302.

The second passivation layer 240 may be disposed on the wiring layer 230. The second passivation layer 240 may be disposed on the upper face of the second substrate 200 in the third direction DR3. The second passivation layer 240 may expose at least a part of the second connection pad 245. The second connection pad 245 may be disposed on the redistribution pattern 235. The second connection pad 245 may be electrically connected to the redistribution pattern 235.

Each of the first to third semiconductor chips 301, 302 and 303 may include first to third passivation films 310, 320 and 330 disposed on the lower faces in the third direction DR3. Each of the first to third passivation films 310, 320 and 330 may expose at least some of the first to third chip pads 315, 325 and 335.

For example, the first to third passivation films 310, 320 and 330 may include an oxide film or a nitride film, and the first to third chip pads 315, 325 and 335 may include, but is not limited to, aluminum (Al).

The third solder ball 30 may be disposed between the second connection pad 245 of the second substrate 200 and the first to third chip pads 315, 325 and 335. The third solder ball 30 may be electrically connected to the second connection pad 245 of the second substrate 200 and the first to third chip pads 315, 325 and 335. This enables the first to third semiconductor chips 301, 302 and 303 to be electrically connected to the second substrate 200 through the third solder balls 30. Further, the first to third semiconductor chips 301, 302 and 303 may be electrically connected to each other through the wiring layer 230 of the second substrate 200.

The first corner V1 of the second substrate 200 may be disposed on the first dummy pattern 160. The first corner V1 of the second substrate 200 may overlap the first dummy pattern 160 in the third direction DR3. At least a part of the first underfill material layer 25 may extend along the first solder resist layer 130 that overlaps the first dummy pattern 160.

The second corner V2 of the second substrate 200 may be disposed on the second dummy pattern 260. The second corner V2 of the second substrate 200 may overlap the second dummy pattern 260 in the third direction DR3. At least a part of the first underfill material layer 25 may extend along first solder resist layer 130 that overlaps the second dummy pattern 260.

As the semiconductor packages gradually become smaller, defects such as warpage may occur during the fabricating process thereof. Such a warpage may be due to the fact that various materials that make up the semiconductor package have coefficients of thermal expansion (CTE) different from each other. For example, the coefficient of thermal expansion of the first substrate 100 may be greater than that of the second substrate 200 and smaller than that of the stiffener 400. As a result, since the first substrate 100, the second substrate 200 and the stiffener 400 have coefficients of thermal expansion different from each other, the first substrate 100 may be convexly bent in the third direction DR3. Therefore, the first to fourth corners V1, V2, V3 and V4 of the second substrate 200 may have higher stress due to a temperature change than other parts. Also, cracks may occur in the first underfill material layer 25 disposed between the first to fourth corners V1, V2, V3 and V4 of the second substrate 200 and the first substrate 100, due to the warpage of the semiconductor package. Such cracks may spread to the second face 100B of the first substrate 100 and affect the second circuit pattern 155, and may cause a poor connection between the semiconductor package and an electronic device (e.g., a mainboard) on which the semiconductor package is mounted.

However, the semiconductor package according to some embodiments of the present disclosure can improve connection reliability, using the first to fourth dummy patterns 160, 260, 360 and 460 of the first substrate 100 that overlap the first to fourth corners V1, V2, V3 and V4 of the second substrate 200.

For example, cracks may occur in the first underfill material layer 25 adjacent to the first to fourth corners V1, V2, V3 and V4 subjected to a relatively lot of stress. Such cracks may not spread to the second face 100B of the first board 100, by the first to fourth dummy patterns 160, 260, 360 and 460 of the first substrate 100 that overlap the first to fourth corners V1, V2, V3 and V4. That is, the first to fourth dummy patterns 160, 260, 360 and 460 may serve as a stop layer for cracks. As a result, the connection reliability of the semiconductor package can be improved.

Figure 5:
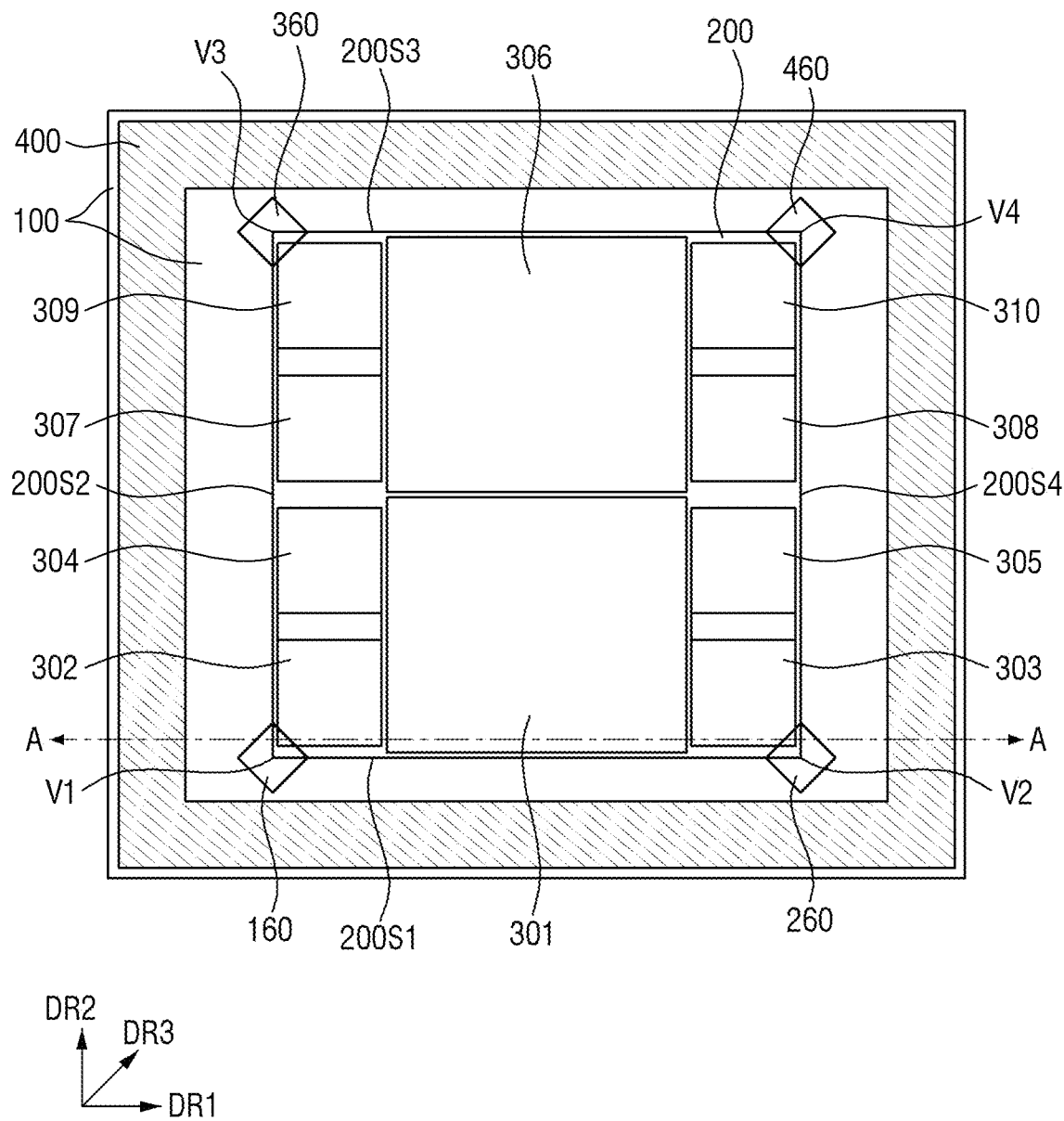
FIG. 5 is an example layout diagram according to example embodiments.

FIG. 5 is an example layout diagram according to example embodiments. A cross-sectional view taken along the line A-A of FIG. 5 may be similar to that of FIG. 2. For convenience of description, points different from those described with reference to FIGS. 1 to 4 will be mainly described.

Referring to FIG. 5, in the semiconductor package according to example embodiments, the first substrate 100 may include first to fourth dummy patterns 160, 260, 360 and 460. The first to fourth dummy patterns 160, 260, 360 and 460 may overlap the first to fourth corners V1, V2, V3 and V4 of the second substrate 200, respectively.

The first to fourth dummy patterns 160, 260, 360 and 460 may have, for example, a diamond shape. The first to fourth dummy patterns 160, 260, 360 and 460 may have the same shape. The first to fourth corners V1, V2, V3 and V4 may be disposed within the diamond shape of the first to fourth dummy patterns 160, 260, 360 and 460. For example, the first to fourth corners V1, V2, V3 and V4 may be disposed at the centers of the first to fourth dummy patterns 160, 260, 360 and 460. However, the present disclosure is not limited thereto, and the first to fourth corners V1, V2, V3 and V4 are not disposed at the centers of the first to fourth dummy patterns 160, 260, 360 and 460, but may be disposed to overlap the first to fourth dummy patterns 160, 260, 360 and 460. Further, the scope of the present disclosure is not limited thereto, and each of the first to fourth dummy patterns 160, 260, 360 and 460 may have a polygonal shape.

The first to fourth dummy patterns 160, 260, 360 and 460 may have, for example, diamond shapes of substantially the same size. However, the scope of the present disclosure is not limited thereto, and the sizes of the first to fourth dummy patterns 160, 260, 360 and 460 may be different from each other.

Figure 6:
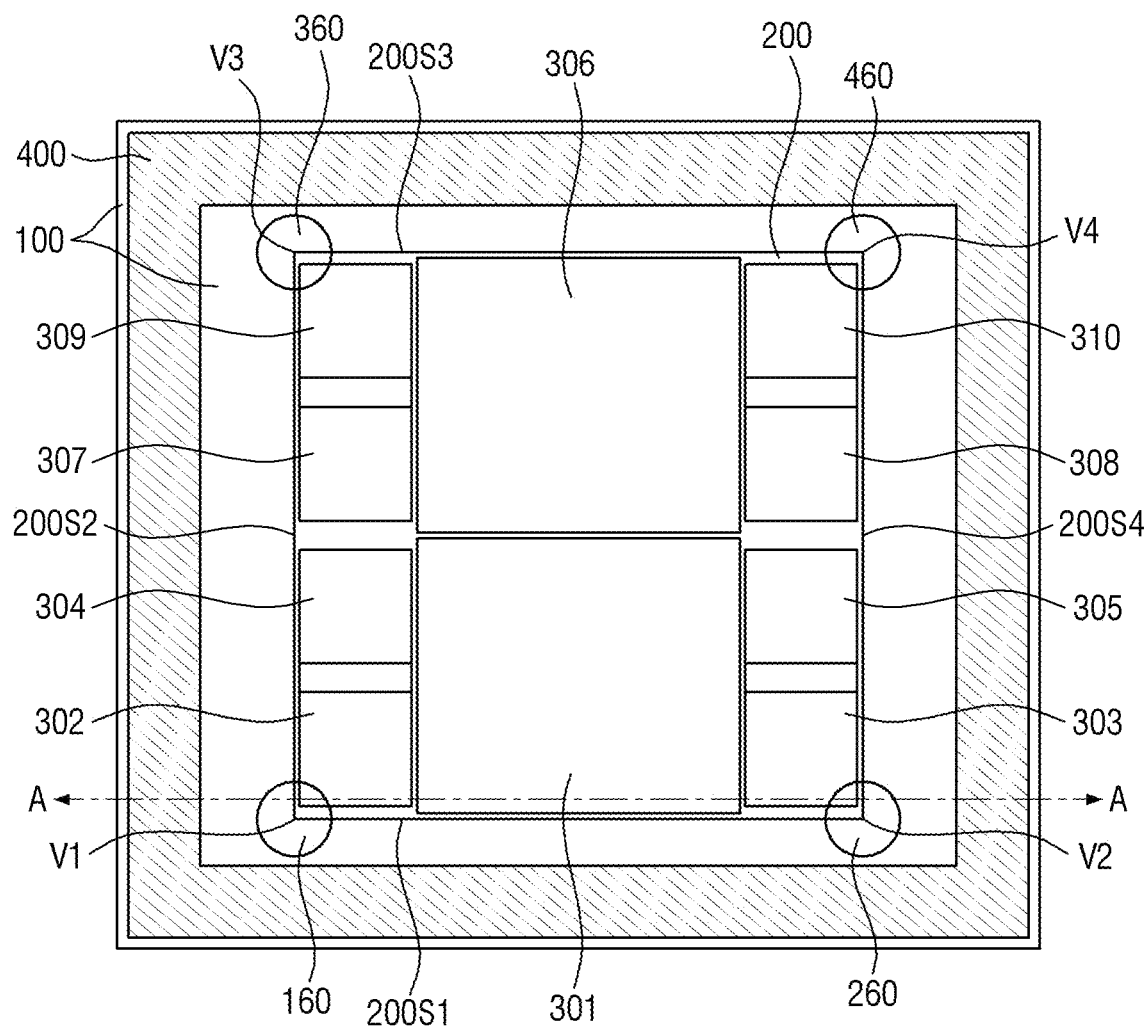
FIG. 6 is an example layout diagram according to example embodiments.
Figure 6:
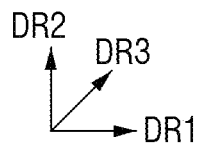

FIG. 6 is an example layout diagram according to example embodiments. A cross- sectional view taken along the line A-A of FIG. 6 may be similar to that of FIG. 2. For convenience of description, points different from those described with reference to FIGS. 1 to 4 will be mainly described.

Referring to FIG. 6, in the semiconductor package according to example embodiments, the first to fourth dummy patterns 160, 260, 360 and 460 of the first substrate 100 may have, for example, a circular shape. The first to fourth dummy patterns 160, 260, 360 and 460 may have the same shape. For example, the first to fourth corners V1, V2, V3 and V4 may be disposed at the centers of the first to fourth dummy patterns 160, 260, 360 and 460. However, the present disclosure is not limited thereto, and the first to fourth corners V1, V2, V3 and V4 are not disposed at the centers of the first to fourth dummy patterns 160, 260, 360 and 460, but may be disposed to overlap the first to fourth dummy patterns 160, 260, 360 and 460.

The first to fourth dummy patterns 160, 260, 360 and 460 may have, for example, a circular shape of substantially the same size. However, the scope of the present disclosure is not limited thereto, and the sizes of the first to fourth dummy patterns 160, 260, 360 and 460 may be different from each other.

Figure 7:
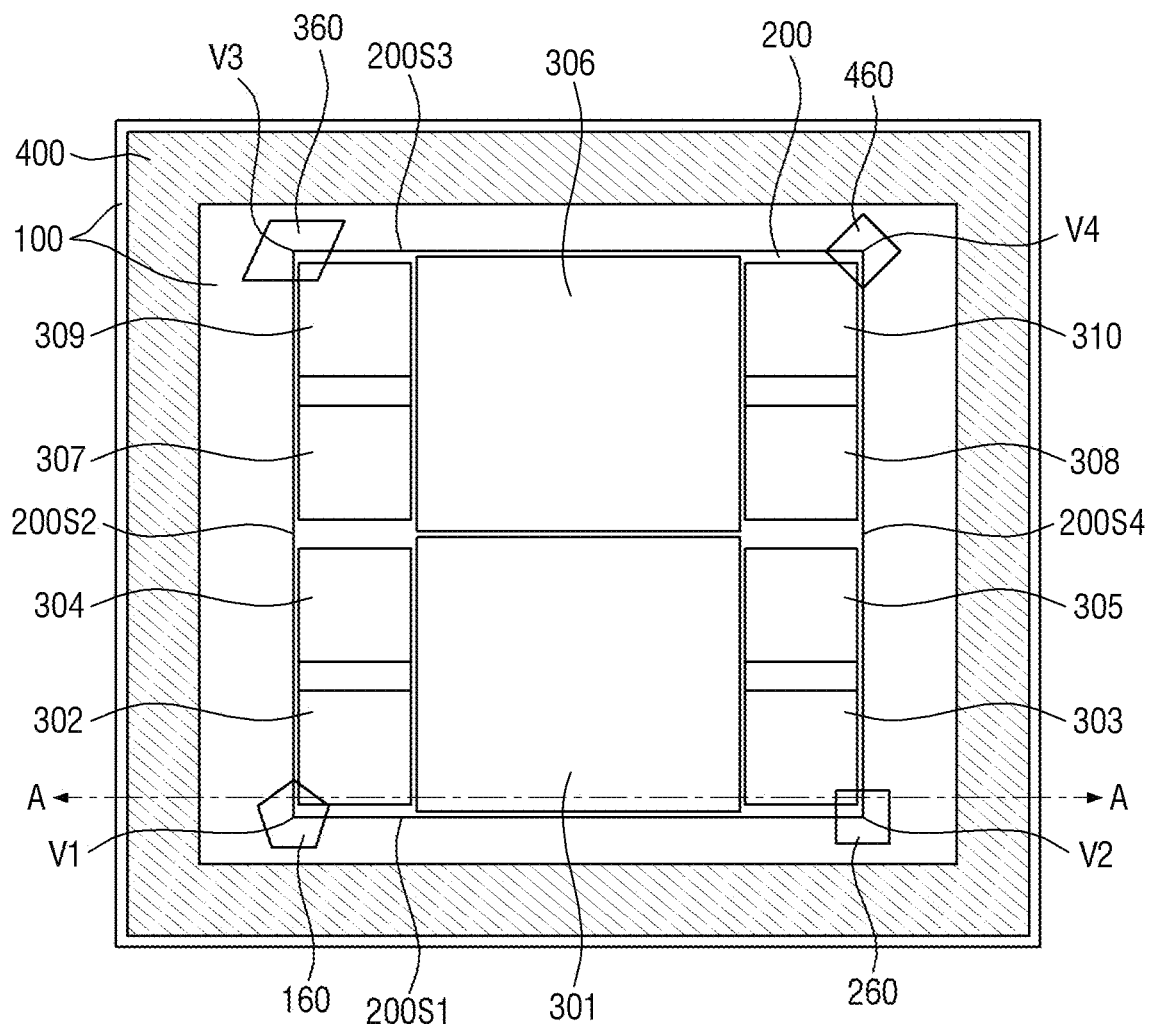
FIG. 7 is an example layout diagram according to example embodiments.

FIG. 7 is an example layout diagram according to some other embodiments of the present disclosure. A cross-sectional view taken along the line A-A of FIG. 7 may be similar to that of FIG. 2. For convenience of description, points different from those described with reference to FIGS. 1 to 4 will be mainly described.

Referring to FIG. 7, in the semiconductor package according to example embodiments, the first to fourth dummy patterns 160, 260, 360 and 460 of the first substrate 100 may have, for example, shapes different from each other, respectively. For example, the first dummy pattern 160 may have a pentagonal shape, the second dummy pattern 260 may have a rectangular shape, the third dummy pattern 360 may have a diamond shape, and the fourth dummy pattern 460 may have a rectangular shape. For example, the first to fourth corners V1, V2, V3 and V4 may be disposed at the centers of the first to fourth dummy patterns 160, 260, 360 and 460. However, the present disclosure is not limited thereto, and the first to fourth corners V1, V2, V3 and V4 are not disposed at the centers of the first to fourth dummy patterns 160, 260, 360 and 460, but may be disposed to overlap the first to fourth dummy patterns 160, 260, 360 and 460.

However, the scope of the present disclosure is not limited thereto, and some of the first to fourth dummy patterns 160, 260, 360 and 460 may have the same shape, and some others thereof may have shapes different from each other. For example, the first and second dummy patterns 160 and 260 may have the same shape, and the third and fourth dummy patterns 460 may have shapes different from the first and second dummy patterns 160 and 260. In addition, the sizes of the first to fourth dummy patterns 160, 260, 360 and 460 may, of course, be different from each other.

In addition, at least some of the first to fourth dummy patterns 160, 260, 360 and 460 may extend along the first to fourth side walls 200S1, 200S2, 200S3 and 200S4 of the second substrate 200. That is, unlike the case shown in the drawing, for example, the first dummy pattern 160 may overlap the first, second and fourth semiconductor chips 301, 302 and 304. The first dummy pattern 160 may have a '\/' shape including a portion extending in the first direction DR1 and a portion extending in the second direction DR2. The fourth dummy pattern 460 may overlap the sixth, eighth and tenth semiconductor chips 306, 308 and 310. The fourth dummy pattern 460 may have a '/\' shape. In addition, the first dummy pattern 160 and the third dummy pattern 360 may extend in the first direction DR1 to form a single dummy pattern.

Figure 8:
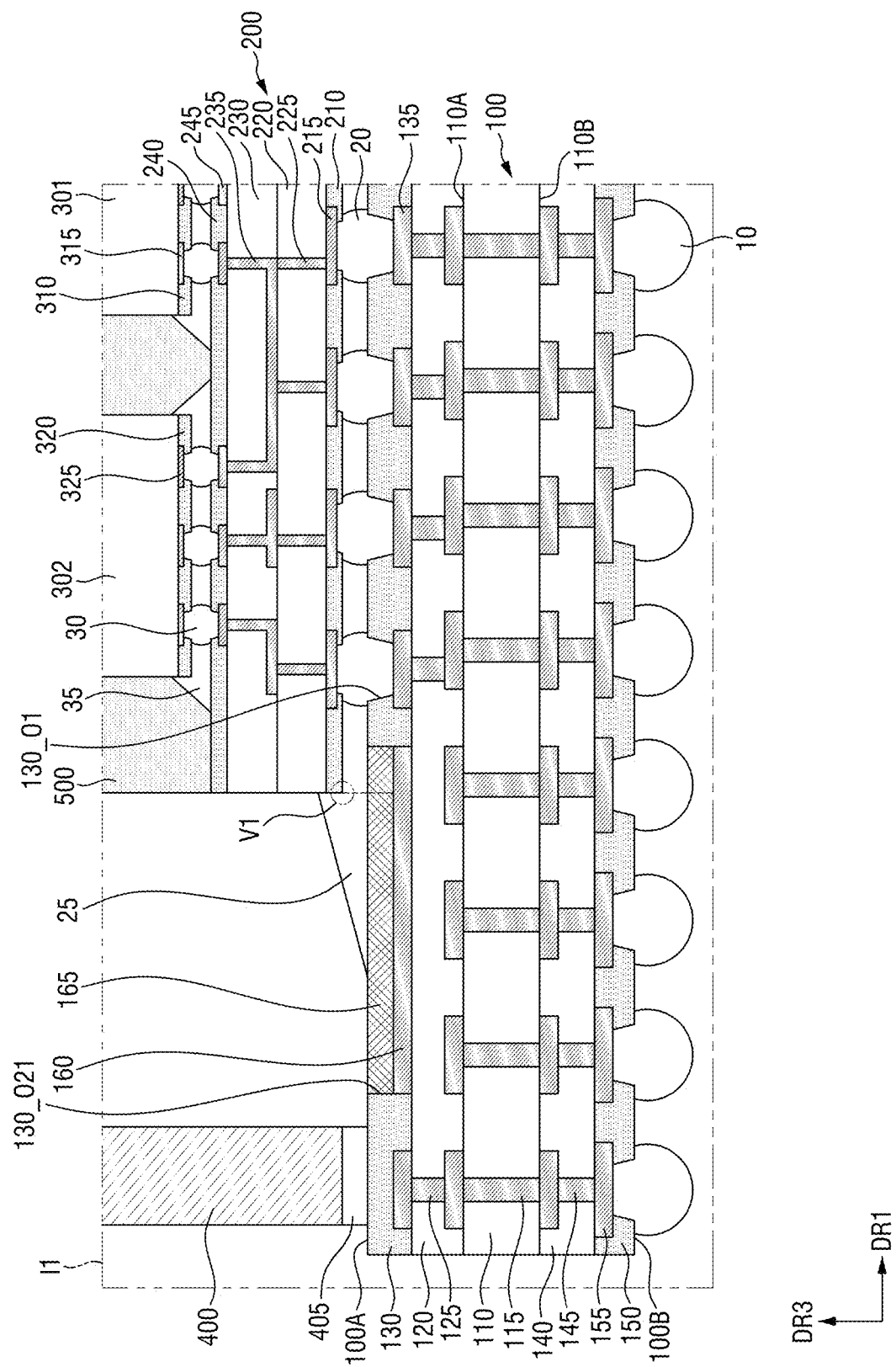
FIG. 8 is an enlarged view of the region I1 of FIG. 2.
Figure 9:
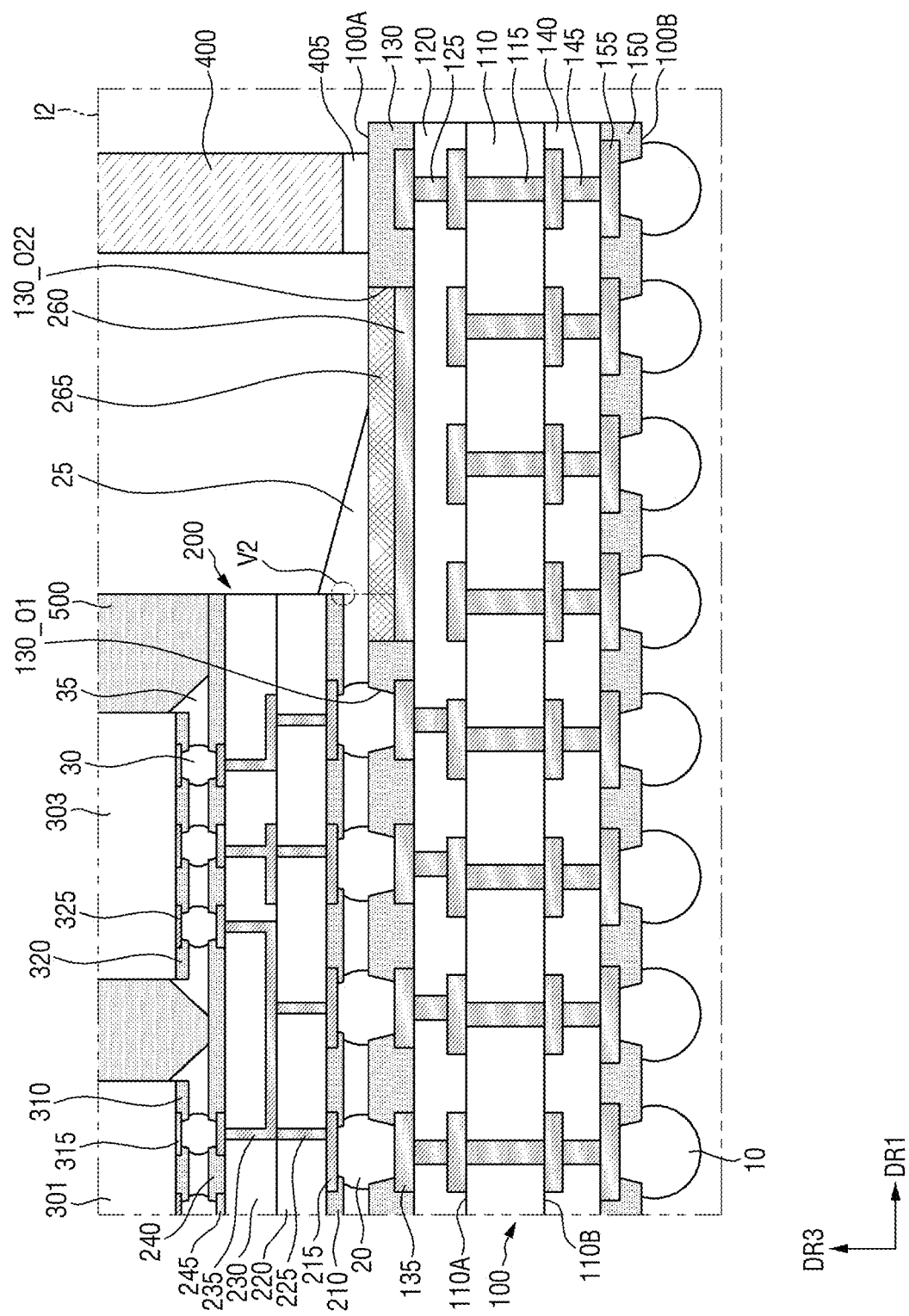
FIG. 9 is an enlarged view of the region I2 of FIG. 2.

FIG. 8 is an enlarged view of the region I1 of FIG. 2. FIG. 9 is an enlarged view of the region I2 of FIG. 2. For convenience of description, points different from those described with reference to FIGS. 1 to 7 will be mainly described.

Referring to FIGS. 8 and 9, a semiconductor package according to example embodiments may further include first and second buffer layers 165 and 265.

The first solder resist layer 130 may further include second openings 130_O21 and 130_O22. The second opening 130_O21 and 130_O22 may further include a first sub-opening 130_O21 that exposes at least a part of the first dummy pattern 160, and a second sub-opening 130_O22 that exposes at least a part of the second dummy pattern 260.

The first buffer layer 165 may be disposed on the first sub-opening 130_O21. The first buffer layer 165 may be disposed on the first dummy pattern 160. The first buffer layer 165 may be in contact with the first dummy pattern 160. The first buffer layer 165 may overlap the first corner V1. The first buffer layer 165 may overlap, for example, the first corner V1 in the third direction DR3.

The second buffer layer 265 may be disposed on the second sub-opening 130_O22. The second buffer layer 265 may be disposed on the second dummy pattern 260. The second buffer layer 265 may be in contact with the second dummy pattern 260. The second buffer layer 265 may overlap the second corner V2. The second buffer layer 265 may overlap, for example, the second corner V2 in the third direction DR3. The first and second buffer layers 165 and 265 may relieve the stress of the first underfill material layer 25 which overlaps the first and second corners V1 and V2, respectively.

The lengths of the first and second buffer layers 165 and 265 in the first direction DR1 may be the same as, for example, the lengths of the first and second dummy patterns 160 and 260 in the first direction DR1, respectively. However, the present disclosure is not limited thereto.

The upper faces of the first and second buffer layers 165 and 265 may be placed, for example, on the same plane as the upper face of the first solder resist layer 130. In another example, the upper faces of the first and second buffer layers 165 and 265 may be placed above the upper face of the first solder resist layer 130 in the third direction DR3. In still another example, the upper faces of the first and second buffer layers 165 and 265 may be placed below the upper face of the first solder resist layer 130 in the third direction DR3.

Elongation of the first and second buffer layers 165 and 265 may be, for example, about twice or more than the elongation of the first solder resist layer 130. The first and second buffer layers 165 and 265 may include, for example, silicon or the like.

At least a part of the first underfill material layer 25 may extend along the first buffer layer 165 overlapping the first dummy pattern 160 and the second buffer layer 265 overlapping the second dummy pattern 260.

Although not shown in the drawing, the first solder resist layer 130 may further include a sub-opening that exposes at least a part of the third and fourth dummy patterns (360 and 460 of FIG. 1), and the buffer layer may, of course, be formed on the third and fourth dummy patterns 460.

Figure 10:
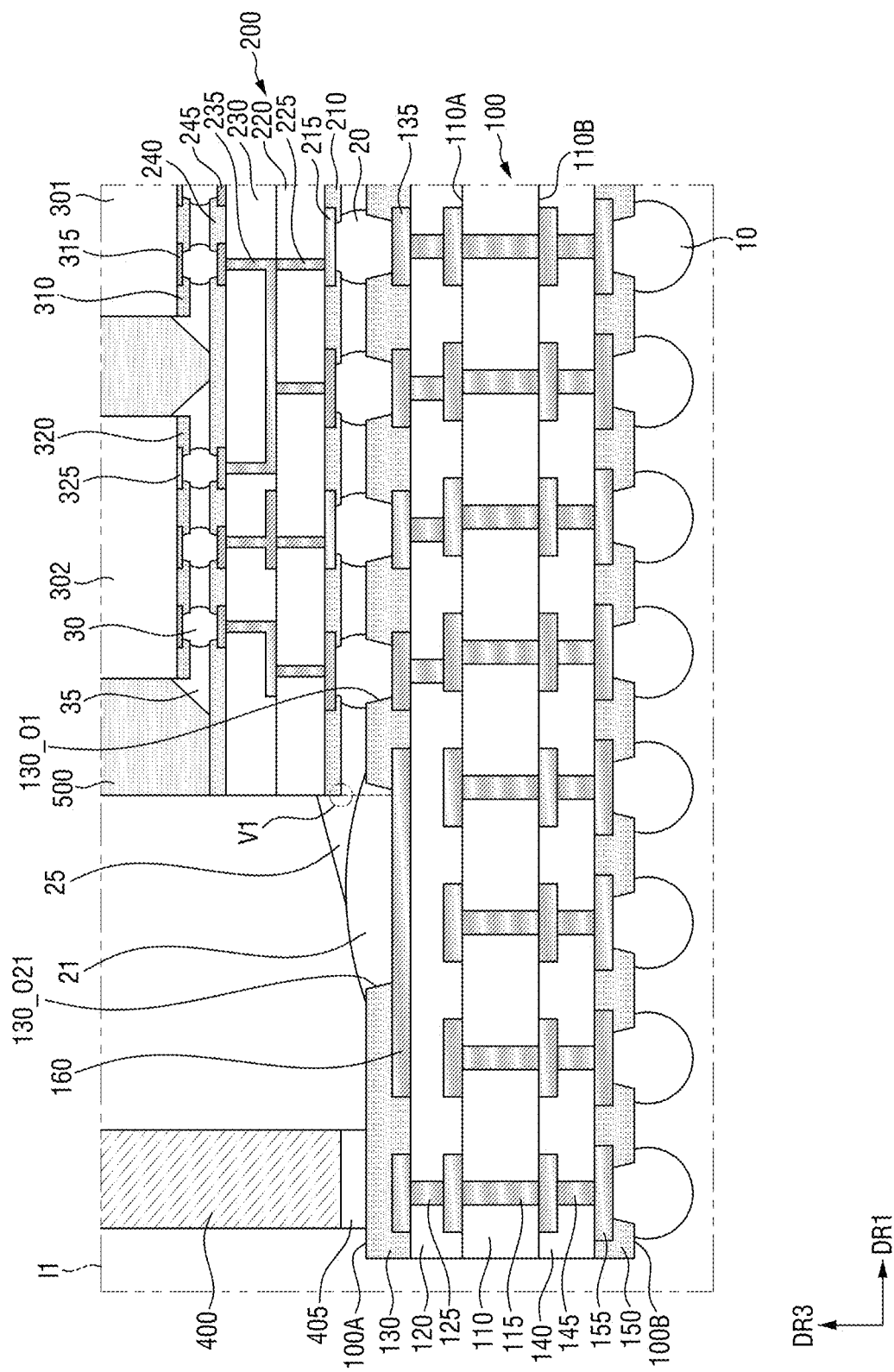
FIG. 10 is an enlarged view of the region I1 of FIG. 2.
Figure 11:
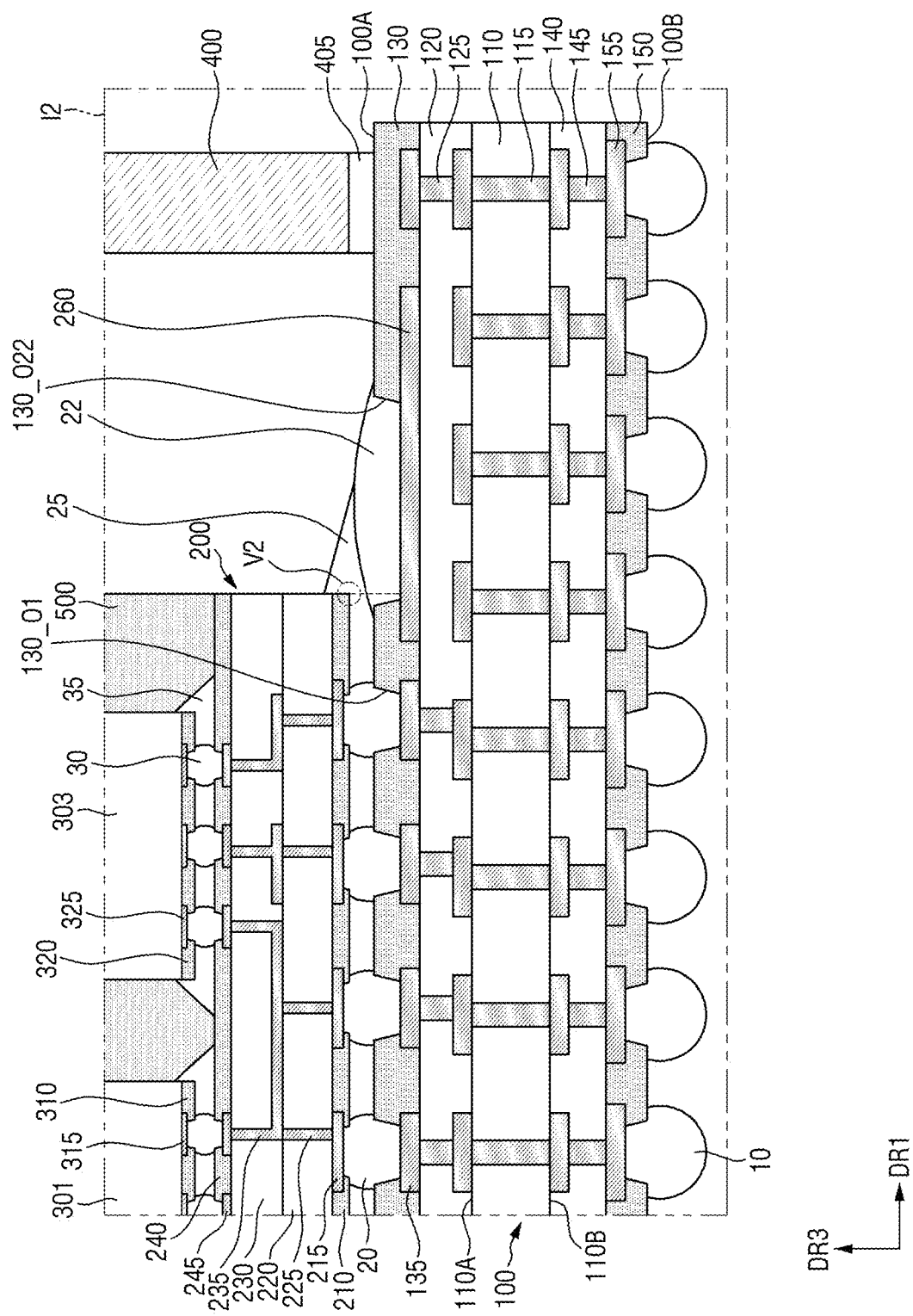
FIG. 11 is an enlarged view of the region I2 of FIG. 2.

FIG. 10 is an enlarged view of the region I1 of FIG. 2. FIG. 11 is an enlarged view of the region I2 of FIG. 2. For convenience of description, points different from those described with reference to FIGS. 1 to 7 will be mainly described.

Referring to FIGS. 10 and 11, a semiconductor package according to example embodiments may further include first and second dummy solder balls 21 and 22.

The first dummy solder ball 21 may be disposed on the first sub-opening 130_O21. The first dummy solder ball 21 may be disposed on the first dummy pattern 160. The first dummy solder ball 21 may be in contact with the first dummy pattern 160. The first dummy solder ball 21 may overlap the first corner V1. The first dummy solder ball 21 may overlap, for example, the first corner V1 in the third direction DR3.

The second dummy solder ball 22 may be disposed on the second sub-opening 130_O22. The second dummy solder ball 22 may be disposed on the second dummy pattern 260. The second dummy solder ball 22 may be in contact with the second dummy pattern 260. The second dummy solder ball 22 may overlap the second corner V2. The second dummy solder ball 22 may overlap, for example, the second corner V2 in the third direction DR3. The first and second dummy solder balls 21 and 22 may relieve the stress of the first underfill material layer 25 which overlaps the first and second corners V1 and V2, respectively.

The upper faces of the first and second dummy solder balls 21 and 22 may be placed above the upper face of the first solder resist layer 130 in the third direction DR3. The first and second dummy solder balls 21 and 22 may be formed, for example, at the same level as the second solder ball 20. That is, the first and second dummy solder balls 21 and 22 may be formed in the same fabricating process as the second solder balls 20. Uppermost faces of the first and second dummy solder balls 21 and 22 in the third direction DR3 may be placed below the uppermost face of the second solder ball 20 in the third direction DR3.

In another example, the first and second dummy solder balls 21 and 22 may be formed at a level different from the second solder balls 20. That is, the first and second dummy solder balls 21 and 22 may be formed after the second solder balls 20 are formed. The uppermost faces of first and second dummy solder balls 21 and 22 in the third direction DR3 may be placed on the substantially same plane as the uppermost face of the second solder ball 20 in the third direction DR3.

The first and second dummy solder balls 21 and 22 may not be connected to the first connection pad 215 of the second substrate 200. The first and second dummy solder balls 21 and 22 may be electrically insulated in the first substrate 100 other than the first and second dummy patterns 160 and 260.

Although the first and second dummy solder balls 21 and 22 may include, for example, at least one of tin (Sn), indium (In), lead (Pb), zinc (Zn), nickel (Ni), gold (Au), silver (Ag), copper (Cu), antimony (Sb), bismuth (Bi), and a combination thereof, the technical idea of the present disclosure is not limited thereto.

At least a part of the first underfill material layer 25 may extend along the first dummy solder ball 21 overlapping the first dummy pattern 160, and the second dummy solder ball 22 overlapping the second dummy pattern 260.

Figure 12:
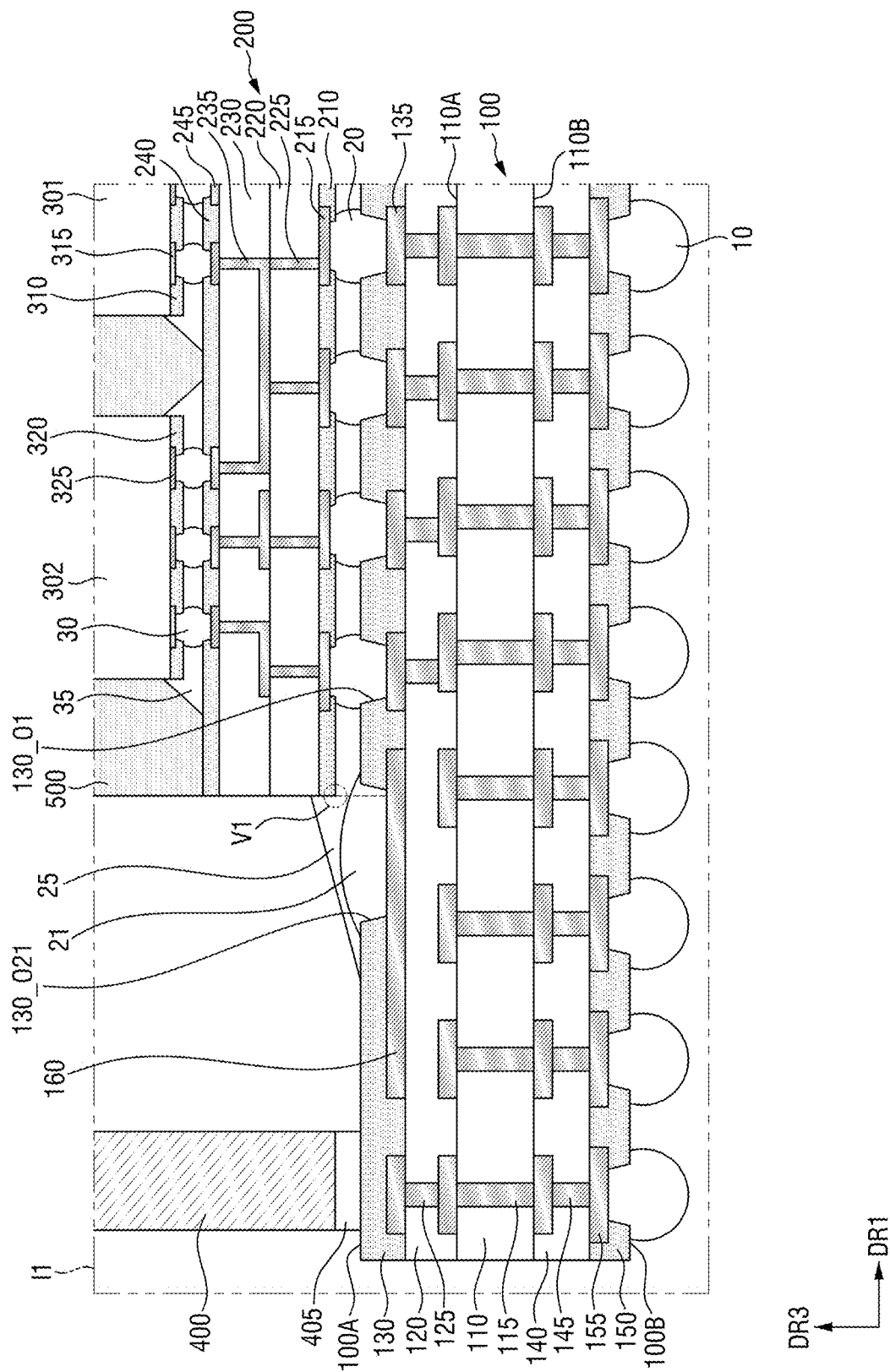
FIG. 12 is an enlarged view of the region I1 of FIG. 2.
Figure 18:
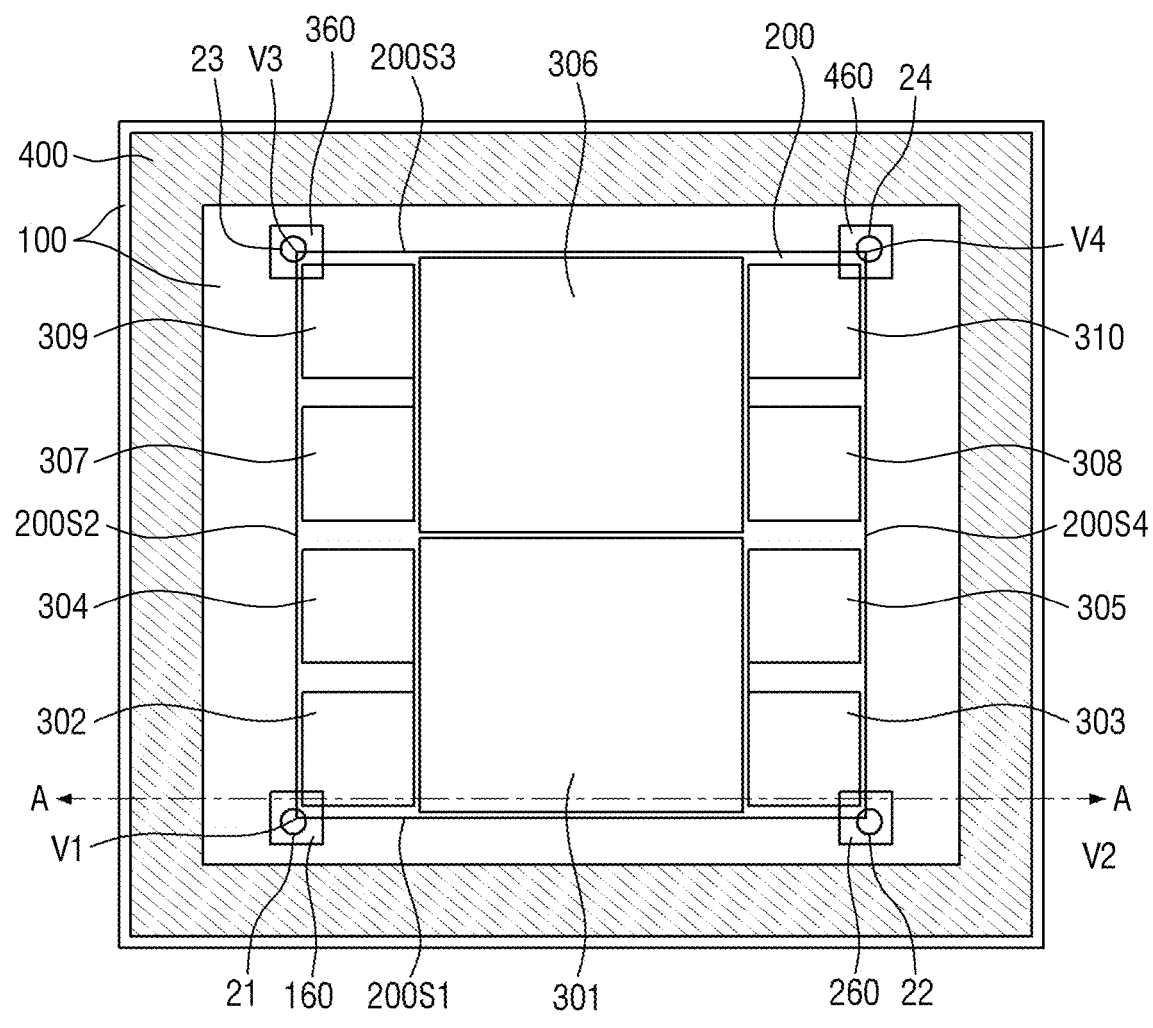
FIG. 18 is an example layout diagram for explaining a semiconductor package according to example embodiments.

Although not shown in FIGS. 11 and 12, the first solder resist layer 130 may further include a sub-opening that exposes at least a part of the third and fourth dummy patterns (360 and 460 of FIG. 1), and the dummy solder balls may, of course, be formed on the third and fourth dummy patterns 460. For example, as shown in FIG. 18, the first dummy solder ball 21, the second dummy solder ball 22, a third dummy solder ball 23, and a fourth dummy solder ball 24 may be arranged to overlap the first corner V1, second corner V2, third corner V3, and fourth corner V4, respectively. The dummy solder balls 21, 22, 23, and 24 may also be referred to as a sub-solder balls 21, 22, 23, and 24.

Figure 13:
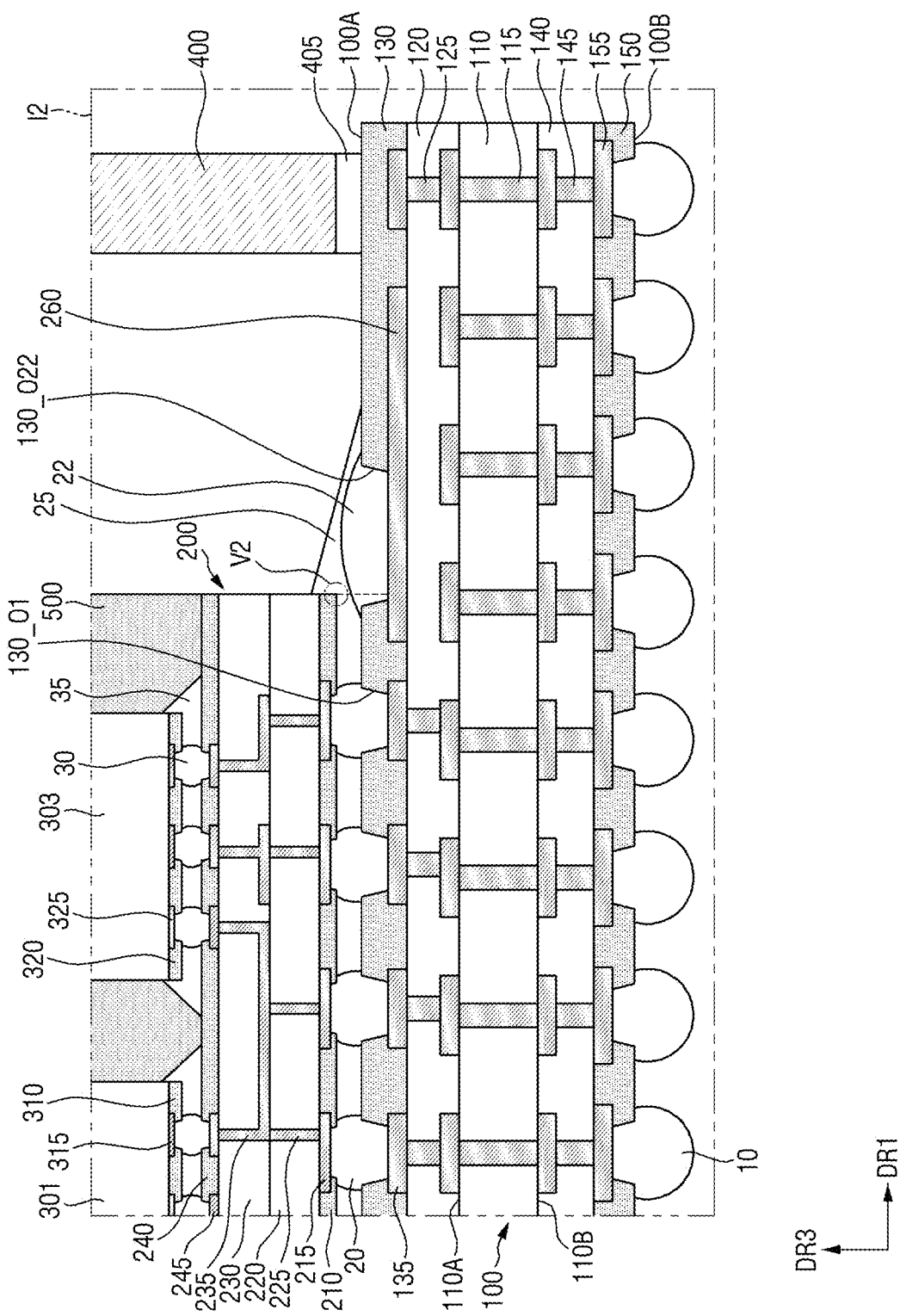
FIG. 13 is an enlarged view of the region I2 of FIG. 2.

FIG. 12 is an enlarged view of the region I1 of FIG. 2. FIG. 13 is an enlarged view of the region I2 of FIG. 2. For convenience of description, points different from those described with reference to FIGS. 10 and 11 will be mainly described.

Referring to FIGS. 12 and 13, in a semiconductor package according to example embodiments, the first underfill material layer 25 may cover first and second dummy solder balls 21 and 22. The first underfill material layer 25 may cover the upper faces of the first and second dummy solder balls 21 and 22. The first underfill material layer 25 may extend along the upper faces of the first and second dummy solder balls 21 and 22, and may extend along the upper face of the first solder resist layer 130.

Although not shown in the drawing, the first solder resist layer 130 may further include a sub-opening that exposes at least a part of the third and fourth dummy patterns (360 and 460 of FIG. 1). The dummy solder balls may be formed on the third and fourth dummy patterns 460, and the first underfill material layer 25 may, of course, cover the dummy solder balls on the third and fourth dummy patterns 460.

Figure 14:
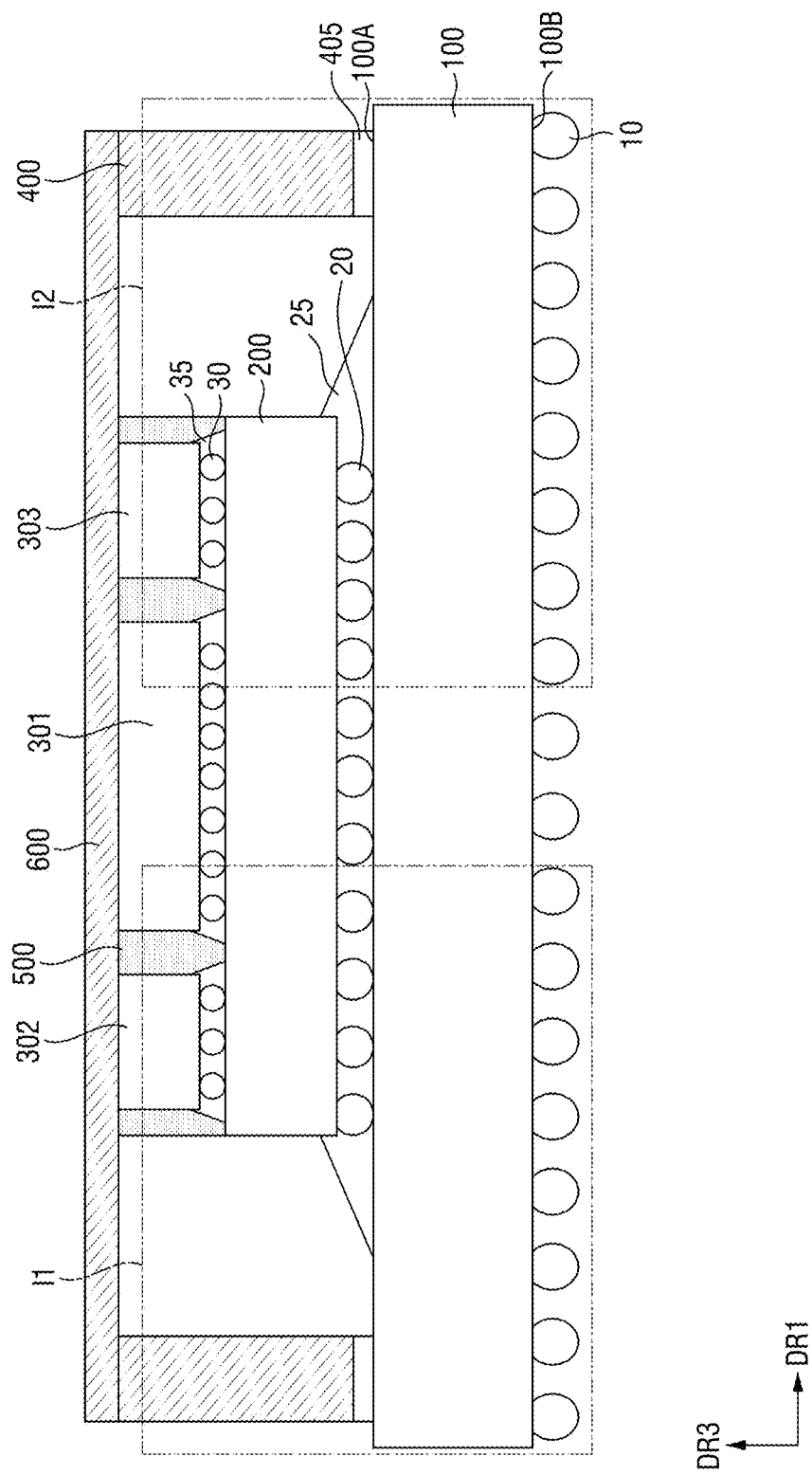
FIG. 14 is a diagram for explaining a semiconductor package according to example embodiments.

FIG. 14 is a diagram for explaining a semiconductor package according to example embodiments. The enlarged view of region I1 and the enlarged view of region I2 of FIG. 14 may be similar to those of FIGS. 3, 4 and 8 to 18 described above. For convenience of description, points different from those described with reference to FIGS. 1 to 13 will be mainly described.

Referring to FIG. 14, a semiconductor package according to example embodiments may be formed by a Chip-On-Wafer process.

For example, the first to third semiconductor chips 301, 302 and 303 may be bonded onto the second substrate 200 by the second solder balls 20. A second underfill material layer 35 may be formed to wrap the second solder ball 20 between the second substrate 200 and the first to third semiconductor chips 301, 302 and 303. Subsequently, a molding layer 500 may be formed to cover the first to third semiconductor chips 301, 302 and 303 on the second substrate 200. Subsequently, a plurality of semiconductor packages may be diced for each semiconductor package. Subsequently, the second substrate 200 having the upper face, to which the first to third semiconductor chips 301, 302 and 303 are bonded, may be bonded onto the first substrate 100 by the first solder balls 10. The first underfill material layer 25 may be formed to wrap the first solder balls 10 between the first substrate 100 and the second substrate 200.

Meanwhile, the semiconductor package according to some other embodiments of the present disclosure may further include a heat slug 600. The heat slug 600 may extend from one side of the stiffener 400 to the other side. The heat slug 600 may be disposed on the molding layer 500. The heat slug 600 may be in contact with the upper face of the first to third semiconductor chips 301, 302 and 303 exposed by the molding layer 500.

The hit slug 600 may include a metal, which is a material having a higher thermal conductivity than air. For example, the heat slug 600 may include copper (Cu), iron (Fe), nickel (Ni), cobalt (Co), tungsten (W), chromium (Cr), silver (Ag), gold (Au), platinum (Pt), tin (Sn), aluminum (Al), magnesium (Mg), silicon (Si), zinc (Zn) or a combination thereof.

Figure 15:
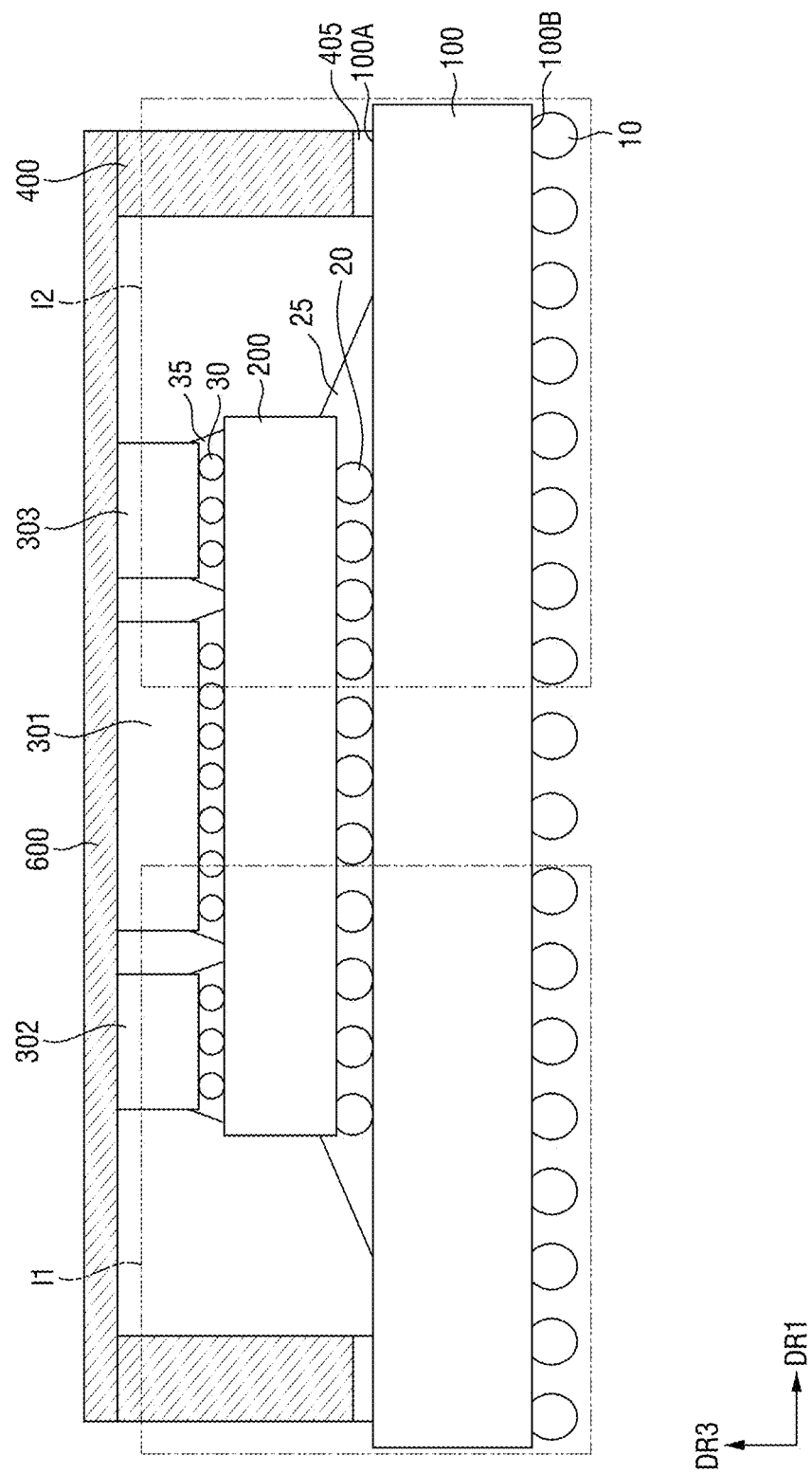
FIG. 15 is a diagram for explaining a semiconductor package according to example embodiments.

FIG. 15 is a diagram for explaining a semiconductor package according to example embodiments. An enlarged view of a region I1 and an enlarged view of a region I2 of FIG. 15 may be similar to those of FIGS. 3, 4 and 8 to 18 described above. For convenience of explanation, points different from those described with reference to FIG. 14 will be mainly described.

Referring to FIG. 15, a semiconductor package according to example embodiments may be formed by a chip-on-substrate (COS) process.

For example, the second substrate 200 may be bonded onto the first substrate 100 by the second solder balls 20. The first underfill material layer 25 may be formed to wrap the second solder balls 20 between the second substrate 200 and the first substrate 100. Subsequently, the first to third semiconductor chips 301, 302 and 303 may be bonded onto the second substrate 200 by the third solder balls 30. The second underfill material layer 35 may be formed to wrap the third solder balls 30 between the second substrate 200 and the first to third semiconductor chips 301, 302 and 303.

The heat slug 600 may extend from one side of the stiffener 400 to the other side. The heat slug 600 may be disposed on the first to third semiconductor chips 301, 302 and 303. The heat slug 600 may be in contact with the upper faces of the first to third semiconductor chips 301, 302 and 303.

Figure 16:
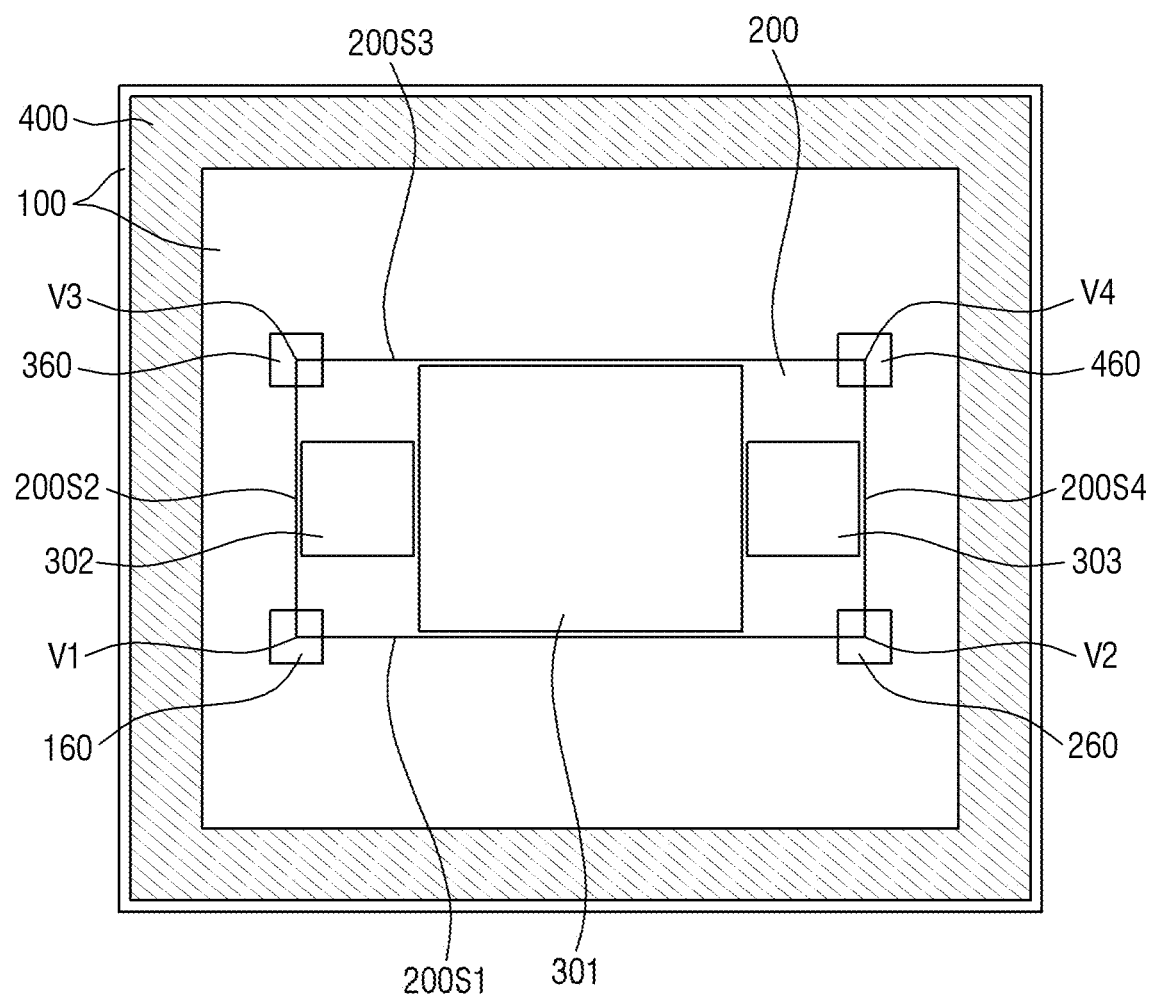
FIG. 16 is a layout diagram for explaining a semiconductor package according to example embodiments.

FIG. 16 is a layout diagram for explaining a semiconductor package according to example embodiments. For convenience of description, points different from those described with reference to FIG. 1 will be mainly described.

Referring to FIG. 16, some other semiconductor packages of the present disclosure may include first to third semiconductor chips 301, 302 and 303 disposed on a second substrate 200. The first to third semiconductor chips 301, 302 and 303 may be spaced apart from each other in the first direction DR1. For example, the second and third semiconductor chips 302 and 303 may be spaced apart from each other in the first direction DR1, and may be disposed on both sides of the first semiconductor chip 301 in the first direction DR1.

As explained above, the first substrate 100 may include the first to fourth dummy patterns 160, 260, 360 and 460. For example, the first dummy pattern 160 of the first substrate 100 may overlap the first corner V1 of the second substrate 200. The second dummy pattern 260 of the first substrate 100 may overlap the second corner V2 of the second substrate 200. The first dummy pattern 160 of the first substrate 100 may overlap the third corner V3 of the second substrate 200. The first dummy pattern 160 of the first substrate 100 may overlap the fourth corner V4 of the second substrate 200.

Figure 17:
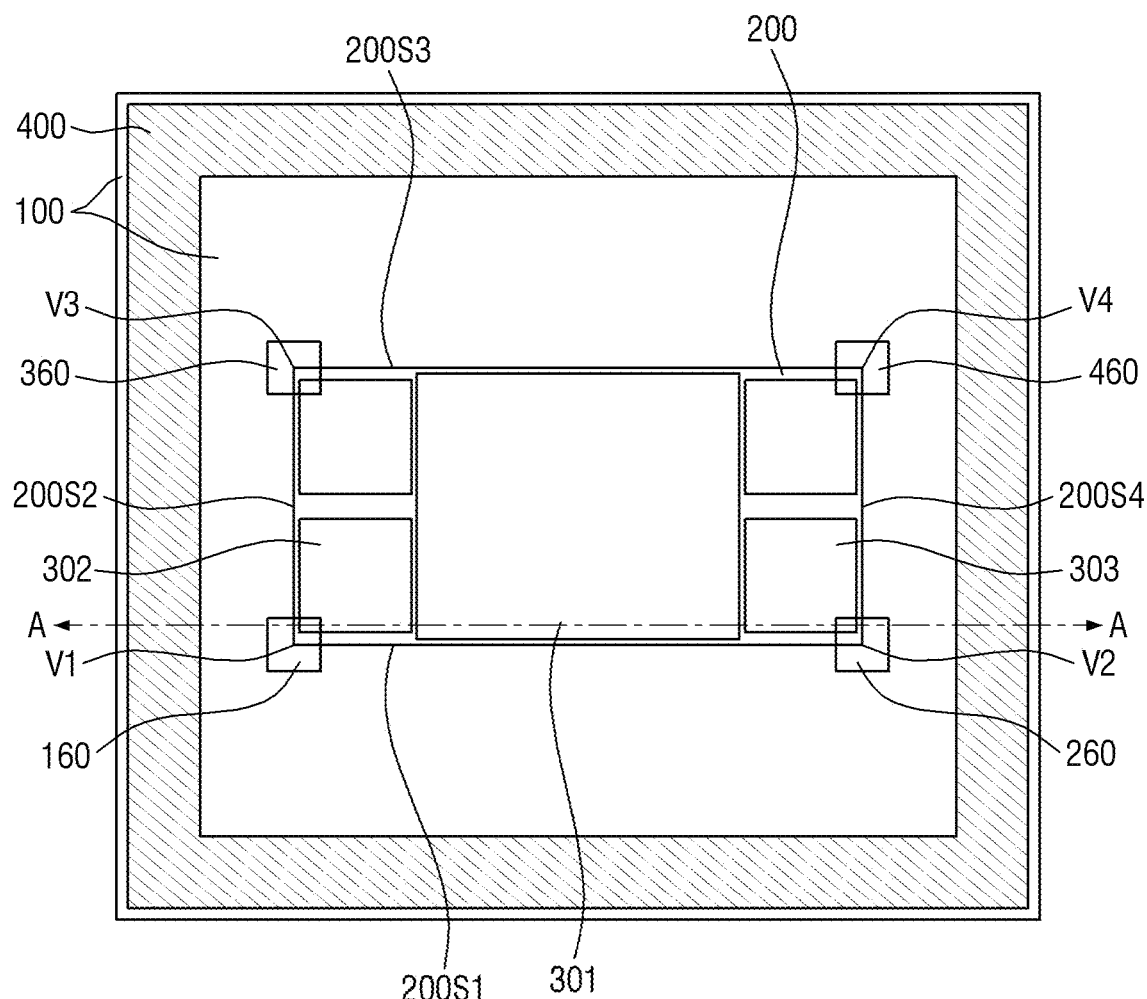
FIG. 17 is a layout diagram for explaining a semiconductor package according to example embodiments.

FIG. 17 is a layout diagram for explaining a semiconductor package according to example embodiments. A cross-sectional view taken along a line A-A of FIG. 17 may be similar to that of FIG. 2. For convenience of description, points different from those described with reference to FIG. 1 will be mainly described.

Referring to FIG. 17, a semiconductor package according to some other embodiments of the present disclosure may include first to fifth semiconductor chips 301, 302, 303, 304 and 305 disposed on the second substrate 200. The first to fifth semiconductor chips 301, 302, 303, 304 and 305 may be spaced apart from each other. For example, the second and third semiconductor chips 302 and 303 may be spaced apart from each other in the first direction DR1, and may be disposed on both sides of the first semiconductor chip 301 in the first direction DR1. The fourth and fifth semiconductor chips 304 and 305 may be spaced apart from each other in the first direction DR1, and may be disposed on both sides of the first semiconductor chip 301 in the first direction DR1. The second and fourth semiconductor chips 302 and 304 may be spaced apart from each other in the second direction DR2, and may be disposed on one side of the first semiconductor chip 301 in the first direction DR1. The third and fifth semiconductor chips 303 and 305 may be spaced apart from each other in the second direction DR2, and may be disposed on the other side of the first semiconductor chip 301 in the first direction DR1.

As explained above, the first substrate 100 may include the first to fourth dummy patterns 160, 260, 360 and 460. For example, the first dummy pattern 160 of the first substrate 100 may overlap the first corner V1 of the second substrate 200. The second dummy pattern 260 of the first substrate 100 may overlap the second corner V2 of the second substrate 200. The first dummy pattern 160 of the first substrate 100 may overlap the third corner V3 of the second substrate 200. The first dummy pattern 160 of the first substrate 100 may overlap the fourth corner V4 of the second substrate 200.

While the present disclosure has been particularly shown and described with reference to the example embodiments thereof, it will be understood by those of ordinary skill in the art that various changes in form and detail may be made therein without departing from the spirit and scope of the present disclosure as defined by the following claims.

What is claimed is:

1. A semiconductor package comprising:
   a first substrate including a circuit pattern and a dummy pattern on an upper face of the first substrate,
   the dummy pattern not being electrically connected to the circuit pattern,
   the first substrate including a solder resist layer on the circuit pattern and the dummy pattern, the solder resist layer including a first opening for exposing at least a part of the circuit pattern and a second opening that exposes at least a part of the dummy pattern;
   a solder ball in the first opening, the solder ball being electrically insulated from the dummy pattern by the solder resist layer;
   a second substrate on the first substrate, the second substrate including a first side wall extending in a first direction and a second side wall extending in a second direction different from the first direction and intersecting the first side wall at a corner, the second substrate electrically connected to the first substrate by the solder ball, the second substrate being electrically insulated from the dummy pattern by the solder resist layer; and
   a buffer layer filling the second opening, the buffer layer overlapping the corner; and
   an underfill material layer between the first substrate and the second substrate, the underfill material layer wrapping around the solder ball,
   wherein a length of the buffer layer is smaller than a length of the solder resist layer in the first direction.

2. The semiconductor package of claim 1, wherein the underfill material layer covers the buffer layer partially, and
   the buffer layer includes a part not overlapping with the underfill material layer.

3. The semiconductor package of claim 1, wherein an upper face of the buffer layer and an upper face of the solder resist layer are coplanar.

4. The semiconductor package of claim 1, wherein the length of the buffer layer and a length of the dummy pattern are same in the first direction.

5. The semiconductor package of claim 1, wherein an upper face of the dummy pattern is lower than an upper face of the solder ball.

6. The semiconductor package of claim 1, wherein a length of the dummy pattern is greater than a length of the circuit pattern in the first direction.

7. The semiconductor package of claim 1, further comprising:
   a stiffener on the first substrate, the stiffener spaced apart from the second substrate,
   wherein the buffer layer does not overlap with the stiffener in a third direction intersecting the first direction and the second direction.

8. The semiconductor package of claim 1, wherein the buffer layer includes silicon.

9. A semiconductor package comprising:
   a first substrate including a first pattern and a second pattern on an upper face of the first substrate, the first substrate including a wiring pattern inside,
   the first pattern being electrically connected to the wiring pattern,
   the second pattern not being electrically connected to the wiring pattern,
   the first substrate including a solder resist layer on the first pattern and the second pattern, the solder resist layer including a first opening for exposing at least a part of the first pattern and a second opening that exposes at least a part of the second pattern;
   a solder ball in the first opening, the solder ball being electrically insulated from the second pattern by the solder resist layer;
   a second substrate on the first substrate, the second substrate including a plurality of sidewalls and a plurality of corners at which the plurality of sidewalls intersect each other, the second substrate electrically connected to the first substrate by the solder ball and being electrically insulated from the second pattern by the solder resist layer;
   a buffer layer filling the second opening, the buffer layer covering the second pattern and overlapping the plurality of corners; and
   an underfill material layer between the first substrate and the second substrate, the underfill material layer wrapping around the solder ball,
   wherein the buffer layer includes silicon.

10. The semiconductor package of claim 9, wherein a bottom surface of the buffer layer contacts an upper surface of the second pattern.

11. The semiconductor package of claim 9, further comprising:
    a first semiconductor chip and a second semiconductor chip on the second substrate, wherein
    the first semiconductor chip and the second semiconductor chip are different from each other and connected to each other through the second substrate.

12. The semiconductor package of claim 9, further comprising:
    a stiffener on the first substrate, the stiffener spaced apart from the plurality of sidewalls of the second substrate,
    wherein the stiffener surrounds the plurality of sidewalls of the second substrate.

13. The semiconductor package of claim 9, wherein an upper face of the buffer layer is spaced apart from a bottom face of the second substrate.

14. The semiconductor package of claim 9,
    wherein the underfill material layer is between the buffer layer and the second substrate.

15. The semiconductor package of claim 14, wherein the buffer layer includes a first part covered by the underfill material layer and a second part not overlapping with the underfill material layer.

16. The semiconductor package of claim 9, wherein a width of the second opening is greater than a width of the first opening.

17. The semiconductor package of claim 9, wherein a sidewall of the buffer layer and a sidewall of the second pattern are coplanar.

18. A semiconductor package comprising:
    a first substrate including a circuit pattern and a dummy pattern on an upper face of the first substrate, the first substrate including a wiring pattern inside,
    the circuit pattern being electrically connected to the wiring pattern,
    the dummy pattern not being electrically connected to the wiring pattern,
    the first substrate including a solder resist layer on the circuit pattern and the dummy pattern, the solder resist layer including a first opening for exposing at least a part of the circuit pattern and a second opening that exposes at least a part of the dummy pattern;
    a solder ball in the first opening, the solder ball being electrically insulated from the dummy pattern by the solder resist layer;

a buffer layer over the second opening, the buffer layer not overlapping with the solder ball in a direction vertical to the first substrate;

a second substrate on the first substrate;

a first semiconductor chip and a second semiconductor chip on the second substrate; and an underfill material layer between the first substrate and the second substrate, the underfill material layer wrapping around the solder ball, wherein an inner sidewall of the dummy pattern and an inner sidewall of the buffer layer are disposed more inside than a sidewall of the second substrate based on a sidewall of the first substrate, the buffer layer includes a first part covered by the underfill material layer and a second part not overlapping with the underfill material layer, and an upper face of the buffer layer and an upper face of the solder resist layer are coplanar.

19. The semiconductor package of claim 18, further comprising:

a stiffener on the first substrate, the stiffener spaced apart from the second substrate, and wherein an outer sidewall of the dummy pattern and an outer sidewall of the buffer layer are disposed more inside than an inner sidewall of the stiffener based on a sidewall of the first substrate.

\* \* \* \* \*